(12) United States Patent
Chatwin

(10) Patent No.: US 10,367,506 B1
(45) Date of Patent: Jul. 30, 2019

(54) DIGITAL CIRCUIT BASED ON A MODIFIED TRISTATE CIRCUIT

(71) Applicant: SONY CORPORATION, Tokyo (JP)

(72) Inventor: Jeremy Gareth Chatwin, Santa Cruz, CA (US)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/213,010

(22) Filed: Dec. 7, 2018

(51) Int. Cl.
| | |
|---|---|
| *H03M 9/00* | (2006.01) |
| *H03K 19/20* | (2006.01) |
| *H03K 19/094* | (2006.01) |
| *H03K 5/1534* | (2006.01) |
| *G11C 11/417* | (2006.01) |
| *H03K 19/0948* | (2006.01) |
| *G11C 11/412* | (2006.01) |

(52) U.S. Cl.
CPC ...... *H03K 19/09429* (2013.01); *G11C 11/412* (2013.01); *G11C 11/417* (2013.01); *H03K 5/1534* (2013.01); *H03K 19/0948* (2013.01); *H03K 19/20* (2013.01); *H03M 9/00* (2013.01)

(58) Field of Classification Search
CPC ......... H03K 19/09429; H03K 19/0948; G11C 11/417; G11C 11/412; H03M 9/00
USPC ....................................................... 341/101
See application file for complete search history.

(56) References Cited

U.S. PATENT DOCUMENTS

| | | | | |
|---|---|---|---|---|
| 7,203,102 B2* | 4/2007 | Brox | .................... | G11C 7/22 |
| | | | | 365/189.04 |
| 7,248,076 B2* | 7/2007 | Chen | .................. | H03K 19/0013 |
| | | | | 326/57 |
| 7,259,588 B2* | 8/2007 | Ahne | .................... | G06K 15/00 |
| | | | | 326/56 |
| 7,532,538 B2* | 5/2009 | Choi | .................... | G11C 7/1051 |
| | | | | 365/189.03 |
| 9,306,572 B2 | 4/2016 | Qi et al. | | |
| 9,479,174 B2 | 10/2016 | Ferrant | | |

OTHER PUBLICATIONS

Fukuda, et al., "A 12.3-mW 12.5-Gb/s Complete Transceiver in 65-nm CMOS Process", IEEE Journal of Solid-State Circuits, vol. 45, Issue 12, Dec. 2010, pp. 2838-2849.
"A 300-MHz BiCMOS Serial Data Transceiver", IEEE Journal of Solid-State Circuits, vol. 29, Issue 3, Mar. 1994, pp. 185-192.

(Continued)

*Primary Examiner* — Brian K Young
(74) *Attorney, Agent, or Firm* — Chip Law Group

(57) ABSTRACT

A tri-state circuit that includes a control circuit coupled to a driver circuit. The driver circuit includes a first type of transistor connected in series with a second type of transistor. The control circuit receives an input data signal at an input data rate and a plurality of clock signals, and supplies a first signal and a second signal to the first type of transistor and the second type of transistor in response to the receipt of the input data signal. The control circuit further controls a tri-state switching operation of the first type of transistor and the second type of transistor such that the input data signal is selected and an output data signal is generated at an output data rate. The tri-state circuit is further utilized in other digital circuits, such as latch circuits, latch-based memory circuits or parallel-to-serial converter circuits to reduce inter symbol interference.

22 Claims, 20 Drawing Sheets

(56) References Cited

OTHER PUBLICATIONS

Hughes, et al., "A Versatile ECL Multiplexer IC for the Gbit/s Range", IEEE Journal of Solid-State Circuits, vol. SC-14, Issue-5, Oct. 1979, pp. 812-817.
Yoo, et al., "A 1.8-V 700-Mb/s/pin 512-Mb DDR-II SDRAM With On-Die Termination and Off-Chip Driver Calibration", IEEE Journal of Solid-State Circuits, vol. 39, Issue 6, Jun. 2004, pp. 941-951.
Ibrahim, et al., "Low-Power CMOS Equalizer Design for 20-Gb/s Systems", IEEE Journal of Solid-State Circuits, vol. 46, Issue 6, Jun. 2011, pp. 1321-1336.
Clarke, et al., "140 Gb/s Serializer Using Clock Doublers in 90 nm SiGe Technology", IEEE Journal of Solid-State Circuits, vol. 50, Issue 11, Nov. 2015, pp. 2703-2713.
Chiang, et al., "A 20-Gb/s 0.13-µm CMOS Serial Link Transmitter Using an LC-PLL to Directly Drive the Output Multiplexer", IEEE Journal of Solid-State Circuits, vol. 40, Issue 4, Apr. 2005, pp. 1004-1011.
Kehrer, et al., "A 30-Gb/s 70-mW One-Stage 4:1 Multiplexer in 013-µm CMOS", IEEE Journal of Solid-State Circuits, vol. 39, Issue 7, Jul. 2004, pp. 1140-1147.
Cong, et al., "A 10-Gb/s 16:1 Multiplexer and 10-GHz Clock Synthesizer in 0.25-cm SiGe BiCMOS", IEEE Journal of Solid-State Circuits, vol. 36, Issue 12, Dec. 2001, pp. 1946-1953.
Mounir Meghelli, "A 43-Gb/s Full-Rate Clock Transmitter in 018-µm SiGe BiCMOS Technology", IEEE Journal of Solid-State Circuits, vol. 40, Issue 10, Oct. 2005, pp. 2046-2050.

\* cited by examiner

| $D_N$ | EN | XEN | N | XP | Q |
|---|---|---|---|---|---|
| 0 | X | 0 | 1 | 1 | 0 |
| 0 | X | 1 | 0 | 1 | Hi-Z |
| 1 | 0 | X | 0 | 1 | Hi-Z |
| 1 | 1 | X | 0 | 0 | 1 |

| $D_N$ | $EN_1$ | $EN_2$ | $XEN_1$ | $XEN_2$ | Q |
|---|---|---|---|---|---|
| 0 | X | X | 0 | 0 | 0 |
| 0 | X | X | 0 | 1 | Hi-Z |
| 0 | X | X | 1 | 0 | Hi-Z |
| 0 | X | X | 1 | 1 | Hi-Z |
| 1 | 0 | 0 | X | X | Hi-Z |
| 1 | 0 | 1 | X | X | Hi-Z |
| 1 | 1 | 0 | X | X | Hi-Z |
| 1 | 1 | 1 | X | X | 1 |

DIGITAL CIRCUIT BASED ON A MODIFIED TRISTATE CIRCUIT

CROSS-REFERENCE TO RELATED APPLICATIONS/INCORPORATION BY REFERENCE

None.

FIELD

Various embodiments of the disclosure relate to transistor-based logic circuits in digital electronics. More specifically, various embodiments of the disclosure relate to a digital circuit, such as a parallel-to-serial (PS) converter circuit, using a modified tri-state circuit to reduce inter symbol interference (ISI) in the digital circuit.

BACKGROUND

With a surge in consumption of data across different platforms, there has been a rise in demand for devices that support reliable data transfer rates while maintaining the integrity and noise margin for the data and associated communication channels. The integrity of data is further pronounced in specific digital circuits that utilizes precise clock signals to time operations of different components to generate a coherent output that retains the integrity and meaning of data without any loss in quality and data rates. Examples of such digital circuits may include a PS converter, an M: N multiplexer, a data flip flop, a latch, a clock divider circuit, and the like. Such digital circuits may be further utilized as inbuilt embedded components of wireless transmitters, CPU buses, processor circuitries, modems, and the like.

Conventional digital circuits (such as PS converters, flip flops, latches, multiplexers, etc.) process data with an error rate in the outputted data that is detected by a receiver component that receives the output of the conventional digital circuits. The receiver component may track low frequency (LF) jitter whilst high frequency (HF) jitter may pass, untracked, through the receiver component and thereby cause a reduction in a jitter tolerance of the receiver component. Jitter tolerance is a measure of the receiver component's ability to tolerate HF jitter at a reliable error rate. Different sources of HF jitter may be present in the digital circuit, arising from both external and internal sources. External sources may include jitter from an applied clock or data source. Internal sources may arise from normal component variations and limitations. One such internal jitter source may be inter-symbol interference (ISI). The effect of ISI is significantly pronounced in the output data rate of the conventional digital circuits. ISI is usually caused by a superposition of successive bits when each bit transition has not been completed within a single bit period, which may be verified by an examination of eye diagram for a continuous portion of bits from the output data. The ISI may be caused by particular circuit components that are repeated within the digital circuit, such as a tri-state gate.

Conventionally, a tri-state circuit act as a switch that is time synchronized to operate a transistor-based network in a pull-up configuration and a pull-down configuration, in accordance with a rising or a falling edge of input clock signal. Each transistor in the pull-up configuration or the pull-down configuration may have intrinsic capacitance, such as a self-loading capacitance. A maximum output current may be utilized to charge or discharge such intrinsic capacitance, which may further define a response time of charging/discharging for the intrinsic capacitance. Conventional tri-state gate utilizes multiple transistors, for example, 3, 4, or even 8 transistors in a series configuration to realize the functional performance of the tri-state gate. Thus, the effective intrinsic capacitance may increase by a factor equal to the number of transistors in series. Accordingly, a response time to charge/discharge the effective intrinsic capacitance may proportionally increase with the increase in the intrinsic capacitance and a decrease in the maximum output current. ISI may be caused in cases where, the charge/discharge time and response time increases to a value that may be substantially larger than a duration of a bit at the output of the tri-state circuit.

Further limitations and disadvantages of conventional and traditional approaches will become apparent to one skill in the art, through comparison of described systems with some aspects of the present disclosure, as set forth in the remainder of the present application and with reference to the drawings.

SUMMARY

A tri-state circuit and different types of digital circuits implemented based on the tri-state circuit are substantially as shown in, and/or described in connection with, at least one of the figures, as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

Certain embodiments of the present disclosure may be found in a tri-state circuit for use with different types of digital circuits. Certain other embodiments of the present disclosure may be found in a parallel-to-serial converter circuit that utilizes a plurality of disclosed tri-state circuits. Other embodiments of the present disclosure may be found in a memory circuit that includes a plurality of latch circuits coupled in a master and slave configuration. Each latch circuit may include two disclosed tri-state circuits that have a pair of complementary output terminals cross-coupled with a pair of inverter circuits. The disclosed tri-state circuit utilizes a minimalistic design approach that facilitates a maximum reduction in inter symbol interference (ISI). The maximum reduction in ISI is further caused by a minimization of self-loading capacitance at the load of the tri-state circuits, which further decreases an effective response time to charge and discharge the self-loading capacitance of the tri-state circuit. The impact of decreased ISI at the load may maintain data integrity and expected output data rates for the tri-state circuit, and other digital logic circuits (for example, the PS converter circuit or the memory circuit) that utilizes the disclosed tri-state circuit.

Figure 1:
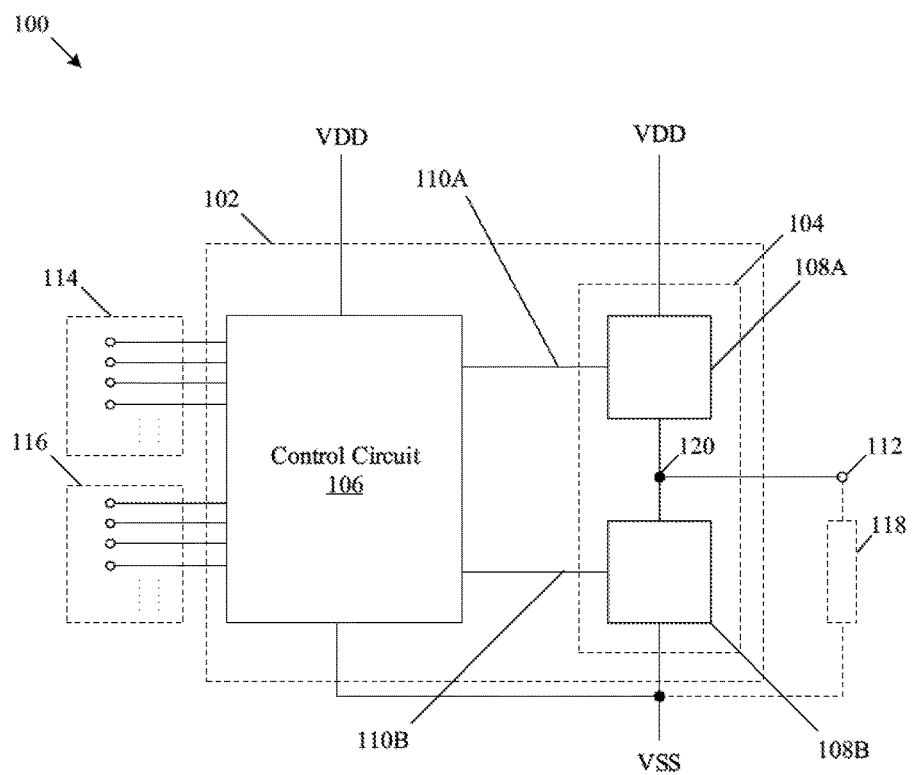
FIG. 1 is a block diagram of a tri-state circuit, in accordance with an embodiment of the disclosure.

FIG. 1 is a block diagram of a tri-state circuit, in accordance with an embodiment of the disclosure. With reference to FIG. 1, there is shown a block diagram 100 of a tri-state circuit 102 that may include a driver circuit 104 and a control circuit 106 coupled to the driver circuit 104. The driver circuit 104 may include a first type of transistor 108A and a second type of transistor 108B coupled electrically to each other in a specific configuration, as shown. The driver circuit 104 may include input terminals 110A and 110B and an output terminal 112. A plurality of input data terminals 114 and a plurality of enable terminals 116 may be connected with the control circuit 106. A power supply (represented by VDD) and a reference ground (represented by VSS) may be further connected to a source terminal of the first type of transistor 108A and the second type of transistor 108B in the driver circuit 104, respectively.

The tri-state circuit 102 may be a digital logic circuit that may be configured to select an input data signal at the output terminal 112 based on a plurality of clock signals received at the tri-state circuit 102, via the plurality of enable terminals 116. The tri-state circuit 102 may operate in at least one of a low-impedance state or a high impedance cut off state. In the low impedance state, the output data signal may be pulled-up (for example, logic "1") or pulled-down (for example, "logic "0") by a switching action of the first type of transistor 108A and the second type of transistor 108B in the driver circuit 104. In the high impedance state, the tri-state circuit 102 may be disconnected from a load 118. The load 118 may be connected to the output terminal 112 of the tri-state circuit 102 through a node 120 between the connection of the first type of transistor 108A and the second type of transistor 108B.

The driver circuit 104 may be a circuit component of the tri-state circuit 102 that switches "ON" and "OFF" to drive the load 118 coupled to the node 120 between the connection of the first type of transistor 108A and the second type of transistor 108B of the tri-state circuit 102. In an exemplary embodiment, the first type of transistor 108A is a p-type metal-oxide semiconductor (MOS) transistor and the second type of transistor 108B is an n-type MOS transistor. In other embodiments, the first type of transistor 108A and the second type of transistor 108B may be at least one of a bipolar junction transistor (BJT) in NPN or PNP configuration, a field effect transistor (FET), other specific types of transistors. Examples of the FET transistor may include, but are not limited to, carbon nanotube FET (CNFET), junction gate FET (JFET), metal-semiconductor FET (MESFET), high-electron mobility transistor (HEMT), inverter-T FET, (ITFET), and fin-FET (FinFET).

The driver circuit 104 may include the first type of transistor 108A in a pull-up configuration and the second type of transistor 108B in a pull-down configuration. Alternatively stated, when switched "ON" or in a closed circuit state, the first type of transistor 108A may drive the load 118 to a potential difference that is equal to that of the power supply (VDD) and the second type of transistor 108B may drive the load 118 to a potential difference that may be equal to that of the reference ground (VSS).

The control circuit 106 may be a digital logic circuit that may control the switching action of the first type of transistor 108A and the second type of transistor 108B in the driver circuit 104. The switching action may be controlled to drive the first type of transistor 108A and the second type of transistor 108B such that the input data signal at the control circuit 106 is selected at the output terminal 112 in at least one state of the tri-state switching action. Otherwise, the control circuit 106 may drive the load 118, connected to the node 120 between the first type of transistor 108A and the second type of transistor 108B, in a cutoff mode. In the cutoff mode, the load 118 is internally disconnected from the circuit configuration of the first type of transistor 108A and the second type of transistor 108B in the driver circuit 104.

In operation, the control circuit 106 of the tri-state circuit 102 may be configured to receive an input data signal at an input data rate through the plurality of input data terminals 114 at the control circuit 106. Similarly, the control circuit 106 may be further configured to receive a plurality of clock signals at a signal frequency that may be utilized to control a switching frequency of the driver circuit 104. The control circuit 106 may include different circuit elements that may be arranged in a configuration specific to obtain a desired pattern of logical output through the node 120 of the driver circuit 104. Alternatively stated, different circuit elements may be arranged and connected to the control circuit 106 in a configuration that may control the driver circuit 104 to generate the output data signal in accordance with a desired logical state from the tri-state circuit 102. For example, the output data signal may mirror the input data signal when an enable signal (clock signal) received at the control circuit 106 may be high (i.e., Logic 1) or when a complementary enable signal (clock signal) received at the control circuit 106 may be low (i.e., Logic 0).

The control circuit 106 may be configured to supply a first signal and a second signal to the first type of transistor 108A and the second type of transistor 108B respectively of the driver circuit 104 through the input terminals 110A and 110B of the driver circuit 104. The first signal may be supplied to the first type of transistor 108A based on a first logical component in the control circuit 106 and the second signal may be supplied to the second type of transistor 108B based on a second logical component in the control circuit 106. Examples of the first logical component and the second logical component may include, but are not limited to, a logical AND gate, a logical NAND gate, a logical NOR gate, and a logical OR gate, and/or a combination of such gates.

The control circuit 108 may further control a tri-state switching operation of the first type of transistor 108A and the second type of transistor 108B in accordance with the first signal and the second signal. The first type of transistor 108A and the second type of transistor 108B may be controlled such that the input data signal is selected at the output terminal 112 of the driver circuit 104 in at least one state in the tri-state switching operation. For example, the input data signal may be selected at the output terminal when the enable signal (the clock signal) turns from low to high, i.e., at the rising edge of the clock signal received at the control circuit 106. Further, the driver circuit 104 may be configured to generate an output data signal at an output data rate for the load 118 connected to the output terminal 112 such that a difference between the input data rate of the received input data signal and the output data rate of the output data signal is a minimum. The difference between the input data rate of the input data signal and the output data rate of the output data signal may be a minimum, based on a charge time and a discharge time for a combined self-loading capacitance of the first type of transistor 108A and the second type of transistor 108B of the driver circuit 104.

The tri-state circuit 102 may utilize only a pair of the first type of transistor 108A and the second type of transistor 108B in the driver circuit 104 to minimize an effect of inter symbol interference (ISI) on the output data signal. Therefore, in contrast to conventional tri-state circuits where the effect of ISI is caused by an increase in a self-loading capacitance value and a decrease in a maximum drive current to connected loads by use of more than two series transistors in the driver circuit 104, the effect of ISI in the output data signal of the tri-state circuit 102 may be minimized as the number of series transistors in the driver circuit 104 are minimum, i.e. only "2" transistors. The minimized effect of ISI may be further pronounced by a minimal distortion (or deviation) in the output data rate (from an expected output data rate) and a maximum drive current at the load 118.

The output data signal from the tri-state circuit 102 may exhibit a minimum superposition of successive bits with transitions of different bits of the clock signals (e.g., low to high or high to low transitions). Thus, the tri-state circuit 102 may cause a reduction in an error rate in the output data signal that may be detected by a receiver component (not shown) at the output terminal 112. The high frequency jitter may be reduced in the tri-state circuit 102 with respect to conventional tri-state circuits to an extent such that different receiver components (or loads) may receive the output data signal without a decrease in jitter tolerance.

The tri-state circuit 102 may be implemented as a data selection switch that may be time synchronized to operate as a transistor-based network in a pull-up configuration and a pull-down configuration, in accordance with a rising or a falling edge of different input clock signals. The first type of transistor 108A in the pull-up configuration and the second type of transistor 108B in the pull-down configuration of the driver circuit 104 may have individual self-loading capacitance (or intrinsic, extrinsic, parasitic, and other types of capacitances). A maximum output current may be utilized to charge or discharge the self-loading capacitance whenever the first type of transistor 108A pulls-up (or pulls the load 118 to the power supply (VDD)) or the second type of transistor 108B pulls-down (pulls the load 118 to the reference ground (VSS)).

The use of only a pair of transistors in the driver circuit of the tri-state gate may further optimize a charge time and a discharge time for the combined self-loading capacitance of the first type of transistor 108A and the second type of transistor 108B. As the output data rate of the output data signal may be based on a transient response time to charge a combined self-loading capacitance of the first type of transistor 108A and the second type of transistor 108B, the disclosed configuration of the tri-state circuit 102 may be adapted such that the transient response time may be synchronized with a duration of a falling edge or a rising edge of the plurality of clock signals.

The charge time and the discharge time for the combined self-loading capacitance of the first type of transistor 108A and the second type of transistor 108B may depend on an amplitude of a drive current generated by the driver circuit 104 for the load 118, through the node 120 of the output terminal 112. The drive current for the load 118 coupled to the output terminal 112 may depend on a number of first type of transistors and second type of transistors in a serial network of the driver circuit 104. Thus, the tri-state circuit 102 may utilize only a pair of transistor in the driver circuit 104 (i.e. the first type of transistor 108A and the second type of transistor 108B in the pull-up and the pull-down configuration) as compared to conventional tri-state circuits that utilize multiple transistors, for example, "3", "4" or even "8" transistors in a series configuration to realize the functional performance of a conventional tri-state circuit. The combined self-loading capacitance in the driver circuit 104 may be optimized in the tri-state circuit 102 by synchronization of a response time to charge/discharge the combined self-loading capacitance with a rise and/or a fall time of the clock signals. For example, the response time to charge capacitance, i.e. 2 CT, may be synchronized with the time it takes the clock signal to rise or fall, in order to avoid any skew in data rates. In another example, if the response time (tau) of the self-loading capacitance is more that the rise time of the clock edge, then the switching action may be affected with respect to required time. In some embodiments, the combined self-loading capacitance in the driver circuit 104 may be optimized in the tri-state circuit 102 by minimization of the self-loading capacitance of the driver circuit, or an increase in the maximum drive current at the load 118 as compared to a reduced value of a maximum drive current in conventional tri-state circuits.

Figures 2A, 2B:
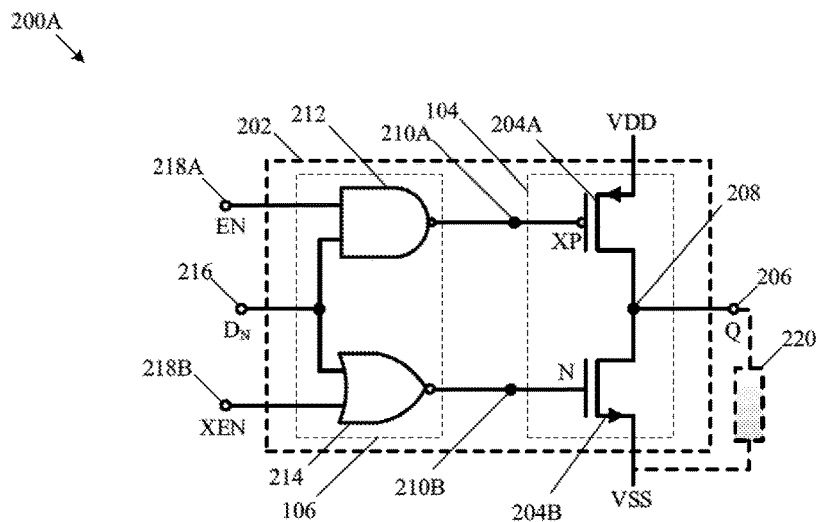
FIG. 2A is a schematic diagram of a tri-state circuit that is controlled by a combination of logic gates, in accordance with an embodiment of the disclosure.
FIG. 2B is a truth table that illustrates different states of operation of the tri-state circuit of FIG. 2A, in accordance with an embodiment of the disclosure.

FIG. 2A is a schematic diagram of a tri-state circuit that is controlled by a combination of logic gates, in accordance with an embodiment of the disclosure. With reference to FIG. 2A, there is shown a schematic diagram 200A of a tri-state circuit 202 that may be a specific implementation of the tri-state circuit 102 of FIG. 1. The tri-state circuit 202 may include the driver circuit 104 and the control circuit 106. The control circuit 106 may be coupled to the driver circuit 104 through the input terminals 210A and 210B of the driver circuit 104.

The driver circuit 104 may include a p-type MOS transistor 204A and an n-type MOS transistor 204B. The p-type MOS transistor 204A may be connected to a power supply (VDD) in a pull-up configuration and the n-type MOS transistor 204B may be coupled to a reference ground (VSS) in a pull-down configuration. An output terminal 206 may be connected to a node 208 present at a connection between the p-type MOS transistor 204A and the n-type MOS transistor 204B. The p-type MOS transistor 204A and the n-type MOS transistor 204B may be further configured to receive a first signal (represented by "XP") and a second signal (represented by N) through the input terminals 210A and 210B of the p-type MOS transistor 204A and the n-type MOS transistor 204B. The first signal (represented by "XP") and the second signal (represented by "N") may be output signals from a logical operation on an input data signal (represented by "$D_N$") and the plurality of clocks signals (represented by "EN" and "XEN") received at the control circuit 106 of the tri-state circuit 202.

The control circuit 106 may include a NAND gate 212 and a NOR gate 214. An output terminal of the NAND gate 212 and the NOR gate 214 may be coupled to the driver circuit 104 through the input terminals 210A and 210B of the driver circuit 104. More specifically, the output terminal from the NAND gate 212 may be coupled to the input terminal 210A of the p-type MOS transistor 204A and the output terminal of the NOR gate 214 may be coupled to the input terminal 210B of the n-type MOS transistor 204B. The NAND gate 212 and the NOR gate 214 may be configured to receive the input data signal ($D_N$) via a first input data terminal 216 that may be obtained by shorting two separate input terminals from the NAND gate 212 and the NOR gate 214.

The NAND gate 212 and the NOR gate 214 may be further configured to receive a plurality of clock signals (EN and XEN) concurrently via a pair of input terminals 218A and 218B on the NAND gate 212 and the NOR gate 214, respectively. The plurality of clock signals (EN and XEN) may include a plurality of first clock signals and a plurality of second clock signals. The plurality of second clock signals may be complementary in phase to the plurality of first clock signals. In certain embodiments, instead of the plurality of first clock signals and the plurality of second clock signals, the plurality of clock signals (EN and XEN) may include a first clock signal (EN) that may be received by the NAND gate 212 via a first input terminal 218A and a second clock signal (XEN) that may be received by the NOR gate 214 via a second input terminal 218B. The first clock signal (EN) may be complementary in phase to the second clock signal (XEN). The tri-state circuit 202 may switch between an open circuit high impedance mode and a closed circuit low impedance mode, in accordance with a rising edge or a falling edge of the plurality of clock signals (EN and XEN) in the tri-state switching operation of the p-type MOS transistor 204A and the n-type MOS transistor 204B in the driver circuit.

In certain embodiments, the first clock signal (EN) may be received by the NAND gate 212 via the first input terminal 218A and the second clock signal (XEN) may be received by the NOR gate 214 via the second input terminal 218B. However, the first clock signal (EN) and the second clock signal (XEN) may be interchangeably received by the NAND gate 212 and the NOR gate 214, without any effect on the functional performance or the expected logical output from the control circuit 106 and the driver circuit 104 of the tri-state circuit 202.

The tri-state circuit 202 at the node 208 may be charged and discharged by only the p-type MOS transistor 204A and the n-type MOS transistor 204B. Thus, for the same size of the p-type MOS transistor 204A and the n-type MOS transistor 204B, the maximum drive current may be optimally obtained across a load 220 in the pull-up stage of the p-type MOS transistor 204A and the n-type MOS transistor 204B. A combined self-loading capacitance at the output stage may be two times the self-loading capacitance ($C_{GATE}$) for a single n-type MOS or a p-type MOS transistor, i.e. "$2 \times C_{GATE}$".

The voltage swing across the load 220 at the node 208 may remain optimal and the drive current ($I_{MAX}$) may increase by about two times the maximum drive current of a conventional tri-state circuit. Such increase in the maximum drive current ($I_{MAX}$) may be achieved by reduction in a number of stacked n-type and p-type MOS transistors in the driver circuit 104 of the tri-state circuit 202. Therefore, a minimum bit period for each data bit in the output data signal is reduced in the tri-state circuit 202 as compared to a minimum bit period achieved for each data bit in the output data signal in a conventional tri-state circuit. Similarly, a maximum value of the output data rate of the output data signal may be greater in the tri-state circuit 202 as compared to the conventional circuits for same value of input data rate of the input data signal, prior to an onset of the ISI in the output data signal.

In some embodiments, the obtained functional performance from the tri-state circuit 202 may be realized also by a modification in a size of the p-type MOS transistor 204A and the n-type MOS transistor 204B used in the driver circuit 104. For example, a reduction in a gate length (L) and a channel width (W) of the p-type MOS transistor 204A and the n-type MOS transistor 204B may further reduce a value of self-loading capacitance (for example, gate capacitance, $C_{GATE}$) as the value of the self-loading capacitance is proportional to the gate length (L) and the channel width (W) of the p-type MOS transistor 204A and the n-type MOS transistor 204B. Such a modification in the size of the p-type MOS transistor 204A and the n-type MOS transistor 204B may reduce power consumption by the p-type MOS transistor 204A and the n-type MOS transistor 204B (in cut-off and saturation states) of the driver circuit 104 of the tri-state circuit 102. The functional states of operation of the tri-state circuit 202 of FIG. 2A has been described, for example, in detail in FIG. 2B.

FIG. 2B is a truth table that illustrates different possible states of operation of the tri-state circuit of FIG. 2A, in accordance with an embodiment of the disclosure. With reference to FIG. 2B, there is shown a logic table 200B that indicates different possible output states (Q) of the tri-state circuit 202 of FIG. 2A obtained in response to different possible logical states of the input data signal ($D_N$), the first clock signal (EN) and the second clock signal (XEN).

In a first possible state, the input data signal ($D_N$) may attain a logic state of "0", the first clock signal (or the enable signal) (EN) may attain a logic state of "0" or "1", i.e., "a state "X" that would not affect the output state of the output data signal (Q)", and the second clock signal (XEN) may attain a logic state of "0". The first signal (XP) output from the NAND gate 212 may attain a logic state of "1" and the second signal (N) output from the NOR gate 214 may attain a logic state of "1". The logical state of "1" of the first signal (XP) and the second signal (N) may pull-down the node 208 or the load 220 (i.e., coupled to the node 208) to the reference ground (VSS). Thus, the output data signal (Q) may attain an output state of "0".

In a second possible state, the input data signal ($D_N$) may attain a logic state of "0", the first clock signal (or the enable signal) (EN) may attain a logic state of "0" or "1", i.e. "a state "X" that would not affect the output state of the output data signal (Q)", and the second clock signal (XEN) may attain a logic state of "1". In one case, the first signal (XP) outputted from the NAND gate 212 may attain a logic state of "1" and the second signal (N) outputted from the NOR gate 214 may attain a logic state of "0". The logic state of "1" for the first signal (XP) and "0" for the second signal (N) may cut-off the driver circuit 104 in a high impedance open circuit mode, where the load 220 coupled to the node 208 may be disconnected from the driver circuit 104 and no drive current may flow through the output terminal to the load 220. In another case, the first signal (XP) outputted from the NAND gate 212 may attain a logic state of "1" and the second signal (N) outputted from the NOR gate 214 may attain a logic state of "0". The logic state of "1" for the first signal (XP) and "0" for the second signal (N) may cut-off the driver circuit 104 in a high impedance open circuit mode, where the load 220 coupled to the node 208 may be disconnected from the driver circuit 104 and no drive current may flow through the output terminal to the load 220. Thus, the output data signal (Q) may attain an output state of "Hi-Z", which represents the high impedance open circuit mode.

In a third possible state, the input data signal ($D_N$) may attain a logic state of "1", the first clock signal (EN) may attain a logic state of "1", and the second clock signal (or the enable signal) (XEN) may attain a logic state of "0" or "1", i.e. "a state "X" that would not affect the output state of the output data signal (Q)". The first signal (XP) outputted from the NAND gate 212 may attain a logic state of "0" and the second signal (N) outputted from the NOR gate 214 may attain a logic state of "0". The logical state of "0" for the first signal (XP) may pull-up the node 208 or the load 220 coupled to the node 208 to the power supply (VDD). Thus, the output data signal (Q) may attain an output state of "1".

Figure 3:
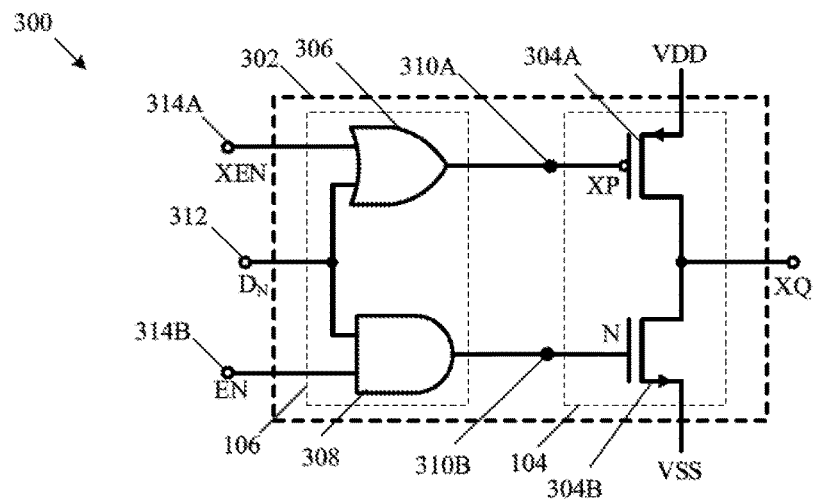
FIG. 3 is a schematic diagram of a tri-state circuit that is controlled by a combination of logic gates, in accordance with an embodiment of the disclosure.

FIG. 3 is a schematic diagram of a tri-state circuit that is controlled by a combination of logic gates, in accordance with another embodiment of the disclosure. With reference to FIG. 3, there is shown a schematic diagram 300 of a tri-state circuit 302 that may be a specific implementation (i.e., an alternative implementation) of the tri-state circuit 102 of FIG. 1. The tri-state circuit 302 may include the driver circuit 104 and the control circuit 106 coupled to the driver circuit 104 through input terminals 310A and 310B of the driver circuit 104. The driver circuit 104 may include a p-type MOS transistor 304A and an n-type MOS transistor 304B. The circuit arrangement of the p-type MOS transistor 304A and the n-type MOS transistor 304B of the driver circuit 104 may be same as that of the driver circuit 104 illustrated in FIG. 2A.

The control circuit 106 may include an OR gate 306 and an AND gate 308. An output terminal of the OR gate 306 and the AND gate 308 may be coupled to the driver circuit 104 through the input terminals 310A and 310B of the driver circuit 104. More specifically, the output terminal from the OR gate 306 may be coupled to the input terminal 310A of the p-type MOS transistor 304A and the output terminal of the AND gate 308 may be coupled to the input terminal 310B of the n-type MOS transistor 304B. The OR gate 306 and the AND gate 308 may be configured to receive an input data signal ($D_N$) via a first input data terminal 312 that may be obtained by shorting two separate input terminals from the OR gate 306 and the AND gate 308.

The OR gate 306 and the AND gate 308 may be further configured to receive a plurality of clock signals (XEN and EN) via a pair of input terminals 314A and 314B on the OR gate 306 and the AND gate 308, as shown. The plurality of clock signals (XEN and EN) may include a plurality of first clock signals and a plurality of second clock signals. The plurality of second clock signals may be complementary in phase to the plurality of first clock signals. In some embodiments, instead of the plurality of first clock signals and the plurality of second clock signals, the plurality of clock signals (XEN and EN) may include a first clock signal (XEN) that may be received by the OR gate 306 via the first input terminal 314A and a second clock signal (EN) that may be received by the AND gate 308 via the second input terminal 314B. The first clock signal (XEN) may be complementary in phase to the second clock signal (EN). The tri-state circuit 302 may switch between an open circuit high impedance mode and a closed circuit low impedance mode, in accordance with a rising edge or a falling edge of the plurality of clock signals in the tri-state switching operation of the p-type MOS transistor 304A and the n-type MOS transistor 304B in the driver circuit 104. In accordance with the tri-state switching operation, the OR gate 306 and the AND gate 308 may control the driver circuit 104 to generate a data signal (XQ) that is complementary in phase to the input data signal ($D_N$).

The first clock signal (XEN) and the second clock signal (EN) may be interchangeably received by the OR gate 306 and the AND gate 308 without any effect on the functional performance or the expected logical output from the control circuit 106 and the driver circuit 104 of the tri-state circuit 302. Similar to the tri-state circuit 202 of FIG. 2A, the tri-state circuit 302 of FIG. 3 may operate in accordance with three different logic states, i.e. "0", "1", and "Hi-Z", with an exception that the output data signal (XQ) is complementary in phase with that of the tri-state circuit o FIG. 2.

Figure 4:
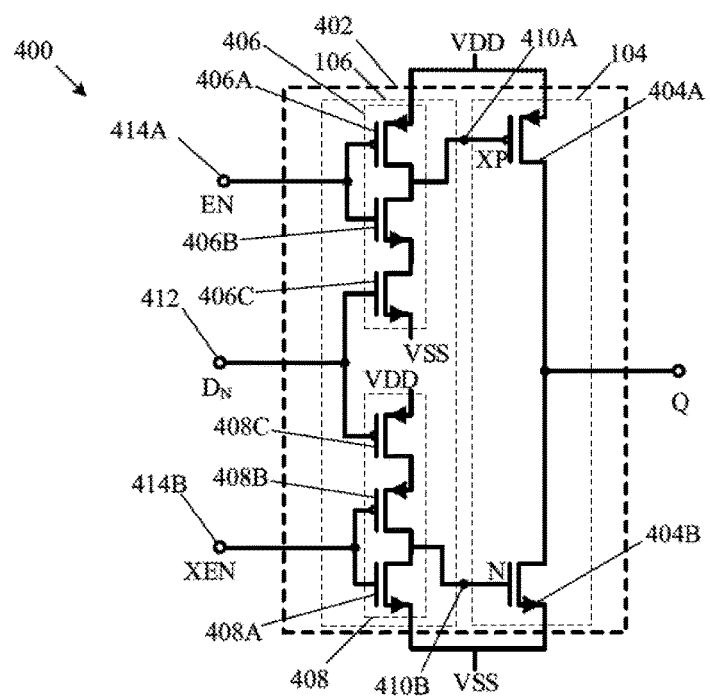
FIG. 4 is a schematic diagram of a tri-state circuit that is controlled by a transistor level circuit in a first type of network configuration, in accordance with an embodiment of the disclosure.

FIG. 4 is a schematic diagram of a tri-state circuit that is controlled by a transistor level circuit in a first type of network configuration, in accordance with an embodiment of the disclosure. With reference to FIG. 4, there is shown a schematic diagram 400 of a tri-state circuit 402 that may be a specific implementation of the tri-state circuit 102 of FIG. 1. The tri-state circuit 402 may include the driver circuit 104 and the control circuit 106. The control circuit 106 may be coupled to the driver circuit 104 through input terminals 410A and 410B of the driver circuit 104. The driver circuit 104 may include a p-type MOS transistor 404A and an n-type MOS transistor 404B. The circuit arrangement of the p-type MOS transistor 404A and the n-type MOS transistor 404B of the driver circuit 104 may be same as that of the driver circuit 104 illustrated in FIG. 2A.

The control circuit 106 may include a plurality of p-type MOS transistors and a plurality of n-type MOS transistors arranged in accordance with a type of network configuration. The type of network configuration may specify an interconnection of different terminals of the plurality of p-type MOS transistors and the plurality of n-type MOS transistors to each other and to the input terminals 410A and 410B of the driver circuit 104. Alternatively stated, the control circuit 106 may include a first component 406 and a second component 408 that have a specific arrangement of the plurality of p-type MOS transistors and the plurality of n-type MOS transistors respectively.

The first component 406 may include a p-type MOS transistor 406A arranged as per a Complementary MOS (CMOS) configuration with a first n-type MOS transistor 406B, and a second n-type MOS transistor 406C serially coupled to the first n-type MOS transistor 406B. The p-type MOS transistor 406A is coupled to a power supply (VDD) in a pull-up configuration, and the second n-type MOS transistor 406C is coupled to a reference ground (VSS) in a pull-down configuration. Similarly, the second component 408 may include a n-type MOS transistor 408A arranged as per CMOS configuration with a first p-type MOS transistor 408B, and a second p-type MOS transistor 408C serially coupled to the first p-type MOS transistor 408B. The n-type MOS transistor 408A is coupled to a reference ground (VSS) in a pull-down configuration and the second p-type MOS transistor 408C is coupled to a power supply (VDD) in a pull-up configuration.

The first component 406 may have a first output terminal at a node present between the connections of the p-type MOS transistor 406A and the first n-type MOS transistor 406B. Similarly, the second component 408 may have a second output terminal at a node present between the connection of the n-type MOS transistor 408A and the first p-type MOS transistor 408B in the second component 408. The first output terminal of the first component 406 may be coupled to the driver circuit 104 through the first terminal 410A of the input terminals 410A and 410B of the driver circuit 104. More specifically, the first output terminal of the first component 406 of the control circuit 106 may be coupled to a gate of the p-type MOS transistor 404A in the driver circuit 104. Similarly, the second output terminal of the second component 408 may be coupled to a gate of the n-type MOS transistor 404B in the driver circuit 104.

The first component 406 and the second component 408 in the control circuit 106 may be configured to receive the input data signal ($D_N$) via a first input data terminal 412 that may be obtained by shorting two separate terminals from gates of the second n-type MOS transistor 406C in the first component 406 and the second p-type MOS transistor 408C in the second component 408 of the control circuit 106.

The first component 406 and the second component 408 in the control circuit 106 may be further configured to receive a plurality of clock signals (EN and XEN) via a pair of input terminals 414A and 414B coupled to the first component 406 and the second component 408, as shown. The plurality of clock signals (EN and XEN) may include a first clock signal (EN) that may be received by the first component 406 via the first input terminal 414A and a second clock signal (XEN) that may be received by the second component 408 via the second input terminal 414B. The first input terminal 414A may be obtained from a combination of gate terminals of the p-type MOS transistor 406A and the first n-type MOS transistor 406B of the first component 406. The second input terminal 414B may be obtained from a combination of the n-type MOS transistor 408A and the first p-type MOS transistor 408B of the second component 408. The first clock signal (EN) may be complementary in phase to the second clock signal (XEN). The tri-state circuit 402 may switch between an open circuit high impedance mode and a closed circuit low impedance mode, in accordance with a rising edge or a falling edge of the plurality of clock signals in the tri-state switching operation of the p-type MOS transistor and the n-type MOS transistor in the driver circuit.

The first clock signal (EN) and the second clock signal (XEN) may be interchangeably received by the first component 406 and the second component 408 without any effect on the functional performance or the expected logical output from the control circuit 106 and the driver circuit 104 of the tri-state circuit 402. Similar to the tri-state circuit 202 of FIG. 2A, the tri-state circuit 402 of FIG. 4 may operate in accordance with three different logic states, i.e. "0", "1", and "Hi-Z".

Figure 5:
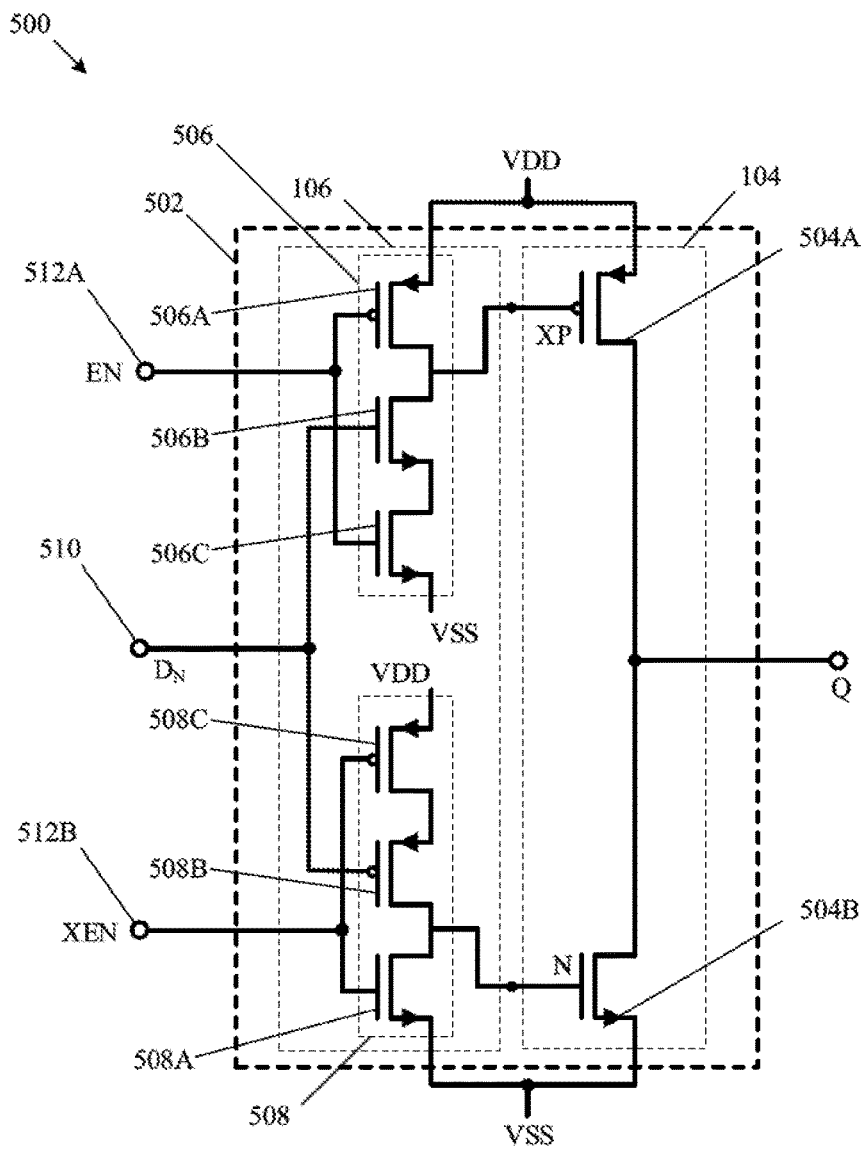
FIG. 5 is a schematic diagram of a tri-state circuit that is controlled by a transistor-based circuit in a second type of network configuration, in accordance with an embodiment of the disclosure.

FIG. 5 is a schematic diagram of a tri-state circuit that is controlled by a transistor-based circuit in a second type of network configuration, in accordance with an embodiment of the disclosure. With reference to FIG. 5, there is shown a schematic diagram 500 of a tri-state circuit 502 that may be a specific and alternative implementation of the tri-state circuits 102, 202, 402 of FIGS. 1, 2A, 3, and 4. The tri-state circuit 502 may include the driver circuit 104 and the control circuit 106 coupled to the driver circuit 104 through the input terminals of the driver circuit 104. The driver circuit 104 may include a p-type MOS transistor 504A and an n-type MOS transistor 504B. The circuit arrangement of the p-type MOS transistor 504A and the n-type MOS transistor 504B of the driver circuit 104 may be same as that of the driver circuit 104 illustrated in FIG. 2A.

The control circuit 106 of the tri-state circuit 502 may include a first component 506 and a second component 508 that may be individually coupled to the input terminals of the driver circuit 104. The first component 506 and the second component 508 in the control circuit 106 of the tri-state circuit 502 may be similar in number and arrangement of constituent n-type and p-type transistors to the first component 406 and the second component 408 of the control circuit 106 in FIG. 4. Therefore, the detail of the first component 506 and the second component 508 has been omitted from the disclosure for the sake of brevity.

In contrast to the control circuit 106 of FIG. 4, the first component 506 and the second component 508 in the control circuit 106 of FIG. 5 may be configured to receive the input data signal ($D_N$) via a first input data terminal 510 that may be obtained by shorting two separate terminals from gates of a first n-type MOS transistor 506B in the first component 506 and a first p-type MOS transistor 508B in the second component 508 of the control circuit 106. Similarly, in contrast to FIG. 4, a first clock signal (EN) may be received by the first component 506 via a first input terminal 512A and a second clock signal (XEN) may be received by the second component 508 via a second input terminal 512B. The first input terminal 512A may be obtained from a combination of gate terminals of a p-type MOS transistor 506A and a second n-type MOS transistor 506C of the first component 506. The second input terminal 512B may be obtained from a combination of an n-type MOS transistor 508A and a second p-type MOS transistor 508C in the second component 508. The first clock signal (EN) may be complementary in phase to the second clock signal (XEN). The tri-state circuit 502 may switch between an open circuit high impedance mode and a closed circuit low impedance mode, in accordance with a rising edge or a falling edge of the plurality of clock signals in the tri-state switching operation of the p-type MOS transistor 504A and the n-type MOS transistor 504B in the driver circuit 104. In accordance with the tri-state switching operation, the first component 506 and the second component 508 may control the driver circuit 104 to generate a data signal (Q) that is in phase with the input data signal ($D_N$).

The first clock signal (EN) and the second clock signal (XEN) may be interchangeably received by the first component 506 and the second component 508 without any effect on the functional performance or the expected logical output from the control circuit 108 and the driver circuit 104 of the tri-state circuit 502. Similar to the tri-state circuit 202 of FIG. 2A, the tri-state circuit 502 of FIG. 5 may operate in accordance with three different logic states, i.e. "0", "1", and "Hi-Z".

Figure 6A:
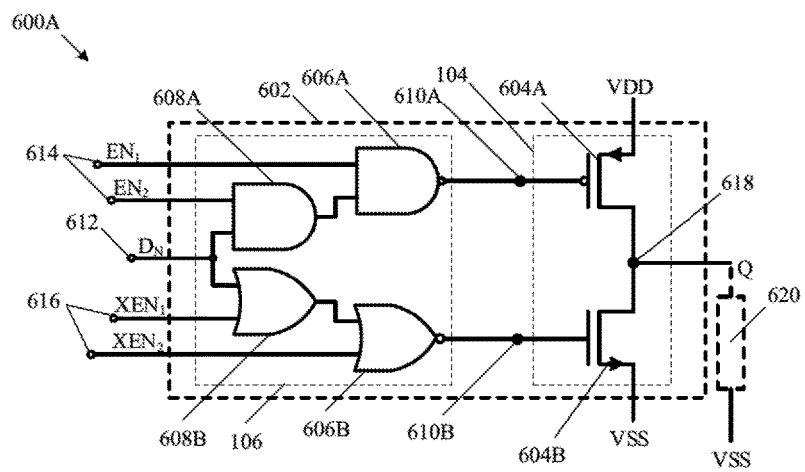
FIG. 6A is a schematic diagram of a tri-state circuit that is controlled by a combination of logic gates in a cascade configuration, in accordance with an embodiment of the disclosure.

FIG. 6A is a schematic diagram of a tri-state circuit that is controlled by a combination of logic gates in a cascade configuration, in accordance with an embodiment of the disclosure. With reference to FIG. 6A, there is shown a schematic diagram 600A of a tri-state circuit 602 that may be a specific and alternative implementation of the tri-state circuits 102, 202, 402, and 502 of FIGS. 1, 2A, 3, 4, and 5. The tri-state circuit 602 may include the driver circuit 104 and the control circuit 106. The control circuit 106 may be coupled to the driver circuit 104 through the input terminals 610A and 610B of the driver circuit 104. The driver circuit 104 may include a p-type MOS transistor 604A and an n-type MOS transistor 604B. The circuit arrangement of the p-type MOS transistor 604A and the n-type MOS transistor 604B of the driver circuit 104 may be same as that of the driver circuit 104 illustrated in FIG. 2A. There is further shown a load 620 coupled to a node 618 and the reference ground (VSS).

The control circuit 106 may include a pair of NAND and NOR gates 606A and 606B and a pair of AND and OR gates 608A and 608B coupled to the pair of NAND and NOR gates 606A and 606B in a cascaded configuration, as shown. The pair of NAND and NOR gates 606A and 606B may be coupled to the driver circuit 104 through input terminals of the driver circuit 104. The input terminal 610A acts as a first output terminal of the pair of NAND and NOR gates 606A and 606B that are coupled to the p-type MOS transistor 604A of the driver circuit 104 through a gate terminal of the p-type MOS transistor 604A. Similarly, the input terminal 6108 of the driver circuit 104 acts as a second output terminal of the pair of the NAND and NOR gates 606A and 606B that are coupled to the n-type MOS transistor 604B through a gate terminal of the n-type MOS transistor 604B of the driver circuit 104.

The pair of NAND and NOR gates 606A and 606B may be configured to receive a first intermediate input signal and a second intermediate input signal as individual outputs from the pair of AND and OR gates 608A and 608B. The pair of AND and OR gates 608A and 608B may receive the input data signal ($D_N$) via a first input data terminal 612 that may be obtained by shorting two separate input terminals of the pair of AND and OR gates 608A and 608B. The NAND gate 606A and the AND gate 608A may be configured to receive a plurality of first clock signals ($EN_1$, $EN_2$) via a first pair of input terminals 614, respectively. Similarly, the NOR gate 606B and the OR gate 608B may be configured to receive a plurality of second clock signals ($XEN_1$, $XEN_2$) via a second pair of input terminals 616. The plurality of second clock signals ($XEN_1$, $XEN_2$) may be complementary in phase to the plurality of first clock signals ($EN_1$, $EN_2$). The plurality of first clock signals ($EN_1$, $EN_2$) may include a first clock signal ($EN_1$) and a second clock signal ($EN_2$) that may be received by the NAND gate 606A and the AND gate 608A, respectively, via the first pair of input terminals 614. Similarly, the plurality of second clock signals ($XEN_1$, $XEN_2$) may include a first complementary clock signal ($XEN_1$) and a second complementary clock signal ($XEN_2$) that may be received by the OR gate 608B and the NOR gate 606B, via the second pair of input terminals 616.

In accordance with an embodiment, the first clock signal ($EN_1$) and the second clock signal ($EN_2$) may be interchangeably received by the first NAND gate 606A and the AND gate 608A, without any effect on the functional performance of the control circuit 106 or the expected logical output from the control circuit 106 and the driver circuit 104 of the tri-state circuit 602. Similarly, the first clock signal ($EN_1$) and the second clock signal ($EN_2$) may be interchangeably received by the NOR gate 606B and the OR gate 608B, without any effect on the functional performance of the control circuit 106 or the expected logical output from the control circuit 106 and the driver circuit 104 of the tri-state circuit 602.

In accordance with an embodiment, the first complementary clock signal ($XEN_1$), and the second complementary clock signal ($XEN_2$) may be interchangeably received by the first NAND gate 606A and the AND gate 608A, without any effect on the functional performance of the control circuit 106 or the expected logical output from the control circuit 106 and the driver circuit 104 of the tri-state circuit 602. Similarly, the first complementary clock signal ($XEN_1$), and the second complementary clock signal ($XEN_2$) may be interchangeably received by the NOR gate 606B and the OR gate 608B, without any effect on the functional performance of the control circuit 106 or the expected logical output from the control circuit 106 and the driver circuit 104 of the tri-state circuit 602. Similar to the tri-state circuit 202 of FIG. 2A, the tri-state circuit 602 of FIG. 6A may operate in accordance with three different logic states, i.e. "0", "1", and "Hi-Z".

Figure 6B:
FIG. 6B is a truth table that illustrates different states of operation of the tri-state circuit of FIG. 6A, in accordance with an embodiment of the disclosure.

FIG. 6B is a table that illustrates different states of operation of the tri-state circuit of FIG. 6A, in accordance with an embodiment of the disclosure. With reference to FIG. 6B, there is shown a logic table 600B that indicates different possible output states (Q) of the tri-state circuit 602 of FIG. 6A obtained in response to different possible logical states of the input data signal ($D_N$), the first clock signal ($EN_1$), the second clock signal ($EN_2$), the first complementary clock signal ($XEN_1$), and the second complementary clock signal ($XEN_2$).

In a first possible state ("0"), the input data signal ($D_N$) may attain a logic state of "0", the first clock signal (or the enable signal) ($EN_1$) and the second clock signal ($EN_2$) may attain a logic state of "0" or "1", i.e. "a state "X" that would not affect the output state of the output data signal (Q)". The first complementary clock signal ($XEN_1$) may attain a logic state of "0", and the second complementary clock signal (XEN$_2$) may attain a logic state of "0". The output signal from the pair of NAND and NOR gates 606A and 606B may pull-down the node 618 or the load 620 coupled to the node 618 and the reference ground (VSS). Thus, the output data signal (Q) may attain an output state of "0".

In a second possible state ("Hi-Z"), the input data signal (D$_N$) may attain a logic state of "0", the first clock signal (or the enable signal) (EN$_1$) and the second clock signal (EN$_2$) may attain a logic state of "0" or "1", i.e. "a state "X" that would not affect the output state of the output data signal (Q)". In a first case, the first complementary clock signal (XEN$_1$) and the second complementary clock signal (XEN$_2$) may together attain a logic state of ("0, 1"), ("1, 0"), and ("1, 1"). Alternatively, in a second case, the input data signal (D$_N$) may attain a logic state of "1", the first clock signal (or the enable signal) (EN$_1$) and the second clock signal (EN$_2$) may together attain a logic state of ("0, 0"), ("0, 1"), and ("1, 0"). The first complementary clock signal (XEN$_1$) and the second complementary clock signal (XEN$_2$) may attain a logic state of "0" or "1", i.e. "a state "X" that would not affect the output state of the output data signal (Q). In both the first case and the second case, the output signal from the pair of NAND and NOR gates 606A and 606B may cut-off the driver circuit 104 in a high impedance open circuit mode, where the load 620 coupled to the node 618 may be disconnected from the driver circuit 104 and no drive current may flow through the output terminal to the load 620. Thus, the output data signal (Q) may attain an output state of "Hi-Z", which represents the high impedance open circuit mode.

In a third possible state ("1"), the input data signal (D$_N$) may attain a logic state of "1", the first clock signal (or the enable signal) (EN$_1$) and the second clock signal (EN$_2$) may together attain a logic state of ("1, 1"). The first complementary clock signal (XEN$_1$) and the second complementary clock signal (XEN$_2$) may attain a logic state of "0" or "1", i.e. "a state "X" that would not affect the output state of the output data signal (Q). The output signal from the pair of NAND and NOR gates 606A and 606B may pull-up the driver circuit 104 in a low impedance closed circuit mode, where the load 620 coupled to the node 618 may be pulled-up and connected to the power supply (VDD) of the driver circuit 104 and a maximum drive current may flow through the output terminal to the load 620. Thus, the output data signal (Q) may attain an output state of "1".

In two of the three possible states, the output state may replicate the state of input data signal (D$_N$) at the node 618 whenever the first complementary clock signal (XEN$_1$) and the second complementary clock signal (XEN$_2$) attain a low state, i.e. "0". Such replication of the input data signal (D$_N$) occurs whenever the input data signal (D$_N$) attains a low state, i.e. 0 (in other words, when D$_N$=0). Also, the output state (Q) may replicate the state of input data signal (D$_N$) at the node 618 whenever the first clock signal (EN$_1$) and the second clock signal (EN$_2$) attain a high state i.e. "1". Such replication of the input data signal (D$_N$) occurs whenever the input data signal (D$_N$) attains a high state, i.e. "1" (in other words, when D$_N$=1). In other possible state, the output state (Q) may be indeterminate due to the high impedance open circuit mode of the tri-state circuit 602.

Figure 7:
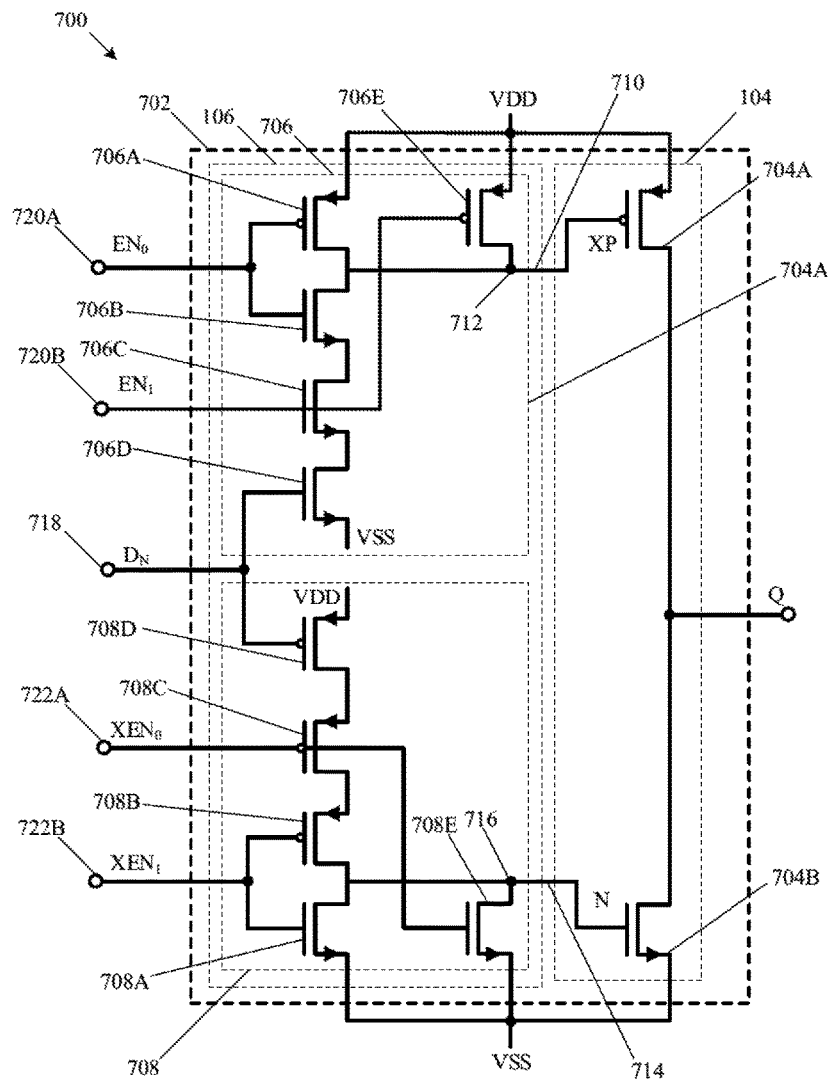
FIG. 7 is a schematic diagram of a tri-state circuit that is controlled by a transistor-based circuit in a third type of network configuration, in accordance with an embodiment of the disclosure.

FIG. 7 is a schematic diagram of a tri-state circuit that is controlled by a transistor-based circuit in a third type of network configuration, in accordance with an embodiment of the disclosure. With reference to FIG. 7, there is shown a schematic diagram 700 of a tri-state circuit 702 that may be a specific and alternative implementation of the tri-state circuits 102, 202, 402, 502, 602 of FIGS. 1, 2A, 3, 4, 5, and 6. The tri-state circuit 702 may include the driver circuit 104 and the control circuit 106 that is coupled to the driver circuit 104 through the input terminals of the driver circuit 104. The driver circuit 104 may include a p-type MOS transistor 704A and an n-type MOS transistor 704B. The circuit arrangement of the p-type MOS transistor 704A and the n-type MOS transistor 704B of the driver circuit 104 may be same as that of the driver circuit 104 illustrated in FIG. 2A.

The control circuit 106 may include a first component 706 and a second component 708 that have a specific arrangement of a plurality of p-type MOS transistors and a plurality of n-type MOS transistors. The plurality of p-type MOS transistors and the plurality of n-type MOS transistors may be arranged in accordance with a type of network configuration. The type of network configuration may specify an interconnection of different terminals of the plurality of p-type MOS transistors and the plurality of n-type MOS transistors to each other and to the input terminals of the driver circuit 104.

The first component 706 may include a p-type MOS transistor 706A arranged as per a CMOS configuration with a first n-type MOS transistor 706B. A second n-type MOS transistor 706C and a third n-type MOS transistor 706D may be serially coupled to each other and to the first n-type MOS transistor 706B. A fourth p-type MOS transistor 706E may be further coupled to the p-type MOS transistor 706A in a parallel configuration. The p-type MOS transistor 706A may be coupled to a power supply (VDD) in a pull-up configuration, and the third n-type MOS transistor 706D may be coupled to a reference ground (VSS) in a pull-down configuration.

The second component 708 may include an n-type MOS transistor 708A arranged as per CMOS configuration with a first p-type MOS transistor 708B. A second p-type MOS transistor 708C and a third p-type MOS transistor 708D may be serially coupled to each other and to the first p-type MOS transistor 708B. A fourth n-type MOS transistor 708E may be further coupled to the n-type MOS transistor 708A in a parallel configuration. The n-type MOS transistor 708A in the second component 708 may be coupled to a reference ground (VSS) in a pull-down configuration and the third p-type MOS transistor 708D may be coupled to a power supply (VDD) in a pull-up configuration.

The first component 706 may have a first output terminal 710 at a node 712 present between the connection of the p-type MOS transistor 706A and the first n-type MOS transistor 706B. Similarly, the second component 708 may have a second output terminal 714 at a node 716 present between the connection of the n-type MOS transistor 708A and the first p-type MOS transistor 708B. The first output terminal 710 of the first component 706 may be coupled to the driver circuit 104 through a first terminal of the input terminals of the driver circuit 104.

The first component 706 and the second component 708 in the control circuit 106 may be configured to receive the input data signal (D$_N$) via a first input data terminal 718 that may be obtained by shorting two separate terminals from gates of the third n-type MOS transistor 706D of the first component 706 and the third p-type MOS transistor 708D of the second component 708 of the control circuit 106. Also, the first component 706 and the second component 708 may be further configured to receive a plurality of first clock signals (EN$_1$ and EN$_2$) via a first pair of input terminals 720A and 720B and a plurality of second clock signals (XEN$_1$ and XEN$_2$) that are complementary in phase to the plurality of first clock signals (EN$_1$ and EN$_2$), via a second pair of input terminals 722A and 722B. A first terminal 720A from the first pair of input terminals 720A and 720B may be obtained from a combination of gate terminals of the p-type MOS transistor 706A and the first n-type MOS transistor 706B of the first component 706. A second terminal 720B of the first pair of input terminals 720A and 720B may be obtained from a combination of the gate terminals of the second n-type MOS transistor 706C and the fourth p-type MOS transistor 706E. Similarly, a first terminal 722A of the second pair of input terminals 722A and 722B may be obtained from a combination of gate terminals of the n-type MOS transistor 708E and the first p-type MOS transistor 708C of the second component 708. A second terminal 722B of the second pair of input terminals 722A and 722B may be obtained from a combination of gate terminals of the second p-type MOS transistor 708B and the fourth n-type MOS transistor 708A of the second component 708. A common terminal may be obtained from a combination of the drain terminals of the p-type MOS transistor 706A and the first n-type MOS transistor 706B. The common terminal may be coupled to the node 712 that is further connected to the drain terminal of the fourth p-type MOS transistor 706E and the input terminal of the driver circuit 104.

In certain embodiments, the arrangement of the input data terminals and the pairs of input terminals for the plurality of clock signals may vary between the first component 706 and the second component 708, without any effect on the functional performance or the expected logical output from the control circuit 106 and the driver circuit 104 of the tri-state circuit 702. Similar to the tri-state circuit 202 of FIG. 2A, the tri-state circuit 702 of FIG. 7 may operate in accordance with three different logic states, i.e. "0", "1", and "Hi-Z".

Figure 8:
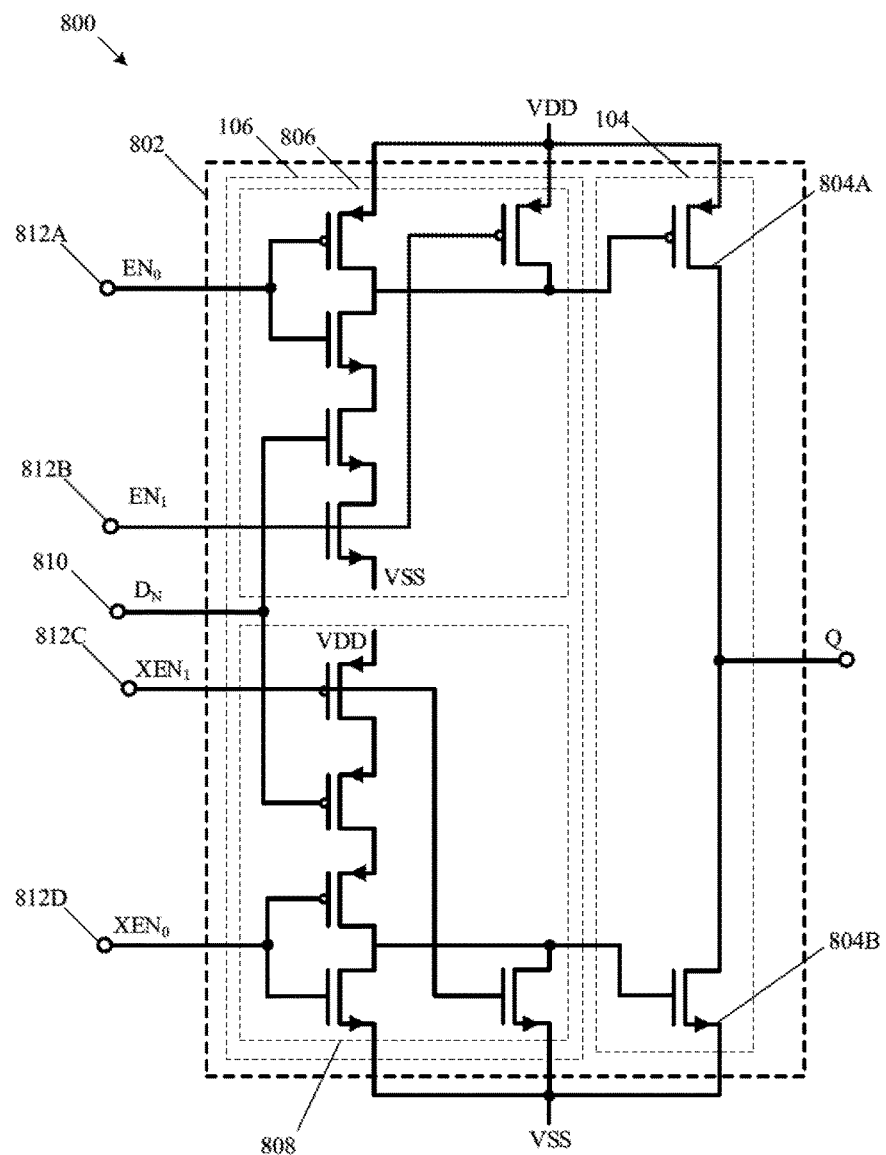
FIG. 8 is a schematic diagram of a tri-state circuit that is controlled by a transistor-based circuit in a fourth type of network configuration, in accordance with an embodiment of the disclosure.

FIG. 8 is a schematic diagram of a tri-state circuit that is controlled by a transistor-based circuit in a fourth type of network configuration, in accordance with an embodiment of the disclosure. With reference to FIG. 8, there is shown a schematic diagram 800 of a tri-state circuit 802 that may be a specific and alternative implementation of the tri-state circuits 102, 202, 302, 402, 502, 602, 702 of FIGS. 1, 2A, and 3 to 7. The tri-state circuit 802 may include the driver circuit 104 and the control circuit 106 coupled to the driver circuit 104 through the input terminals of the driver circuit 104. The driver circuit 104 may include a p-type MOS transistor 804A and an n-type MOS transistor 804B. The circuit arrangement of the p-type MOS transistor 804A and the n-type MOS transistor 804B of the driver circuit 104 may be same as that of the driver circuit 104 of FIG. 2A.

The control circuit 106 of the tri-state circuit 802 may include a first component 806 and a second component 808 that may be individually coupled to the input terminals of the driver circuit 104. The first component 806 and the second component 808 in the control circuit 106 of the tri-state circuit 802 may be similar in number and arrangement of constituent n-type and p-type transistors to the first component 706 and the second component 708 of the control circuit 106 in FIG. 7. Therefore, the detail of the first component 806 and the second component 808 of FIG. 8 has been omitted from the disclosure for the sake of brevity.

In contrast to the tri-state circuit 702 of FIG. 7, the tri-state circuit 802 of FIG. 8 may include different connections of the input data terminal 718, the first pair of input terminals 722A and 722B, and the second pair of input terminals 720A and 720B with n-type transistors and p-type transistors in the control circuit 106. The arrangement of an input data terminal 810 and pairs of input terminals 812A, 812B, 812C, and 812D for the plurality of clock signals (EN$_1$, EN$_2$, XEN$_1$ and XEN$_2$) may vary between the first component 806 and the second component 808 without any effect on the functional performance or the expected logical output from the control circuit 106 and the driver circuit 104 of the tri-state circuit 802. Similar to the tri-state circuit 202 of FIG. 2A, the tri-state circuit 802 of FIG. 8 may operate in accordance with three different logic states, i.e. "0", "1", and "Hi-Z".

Figure 9A:
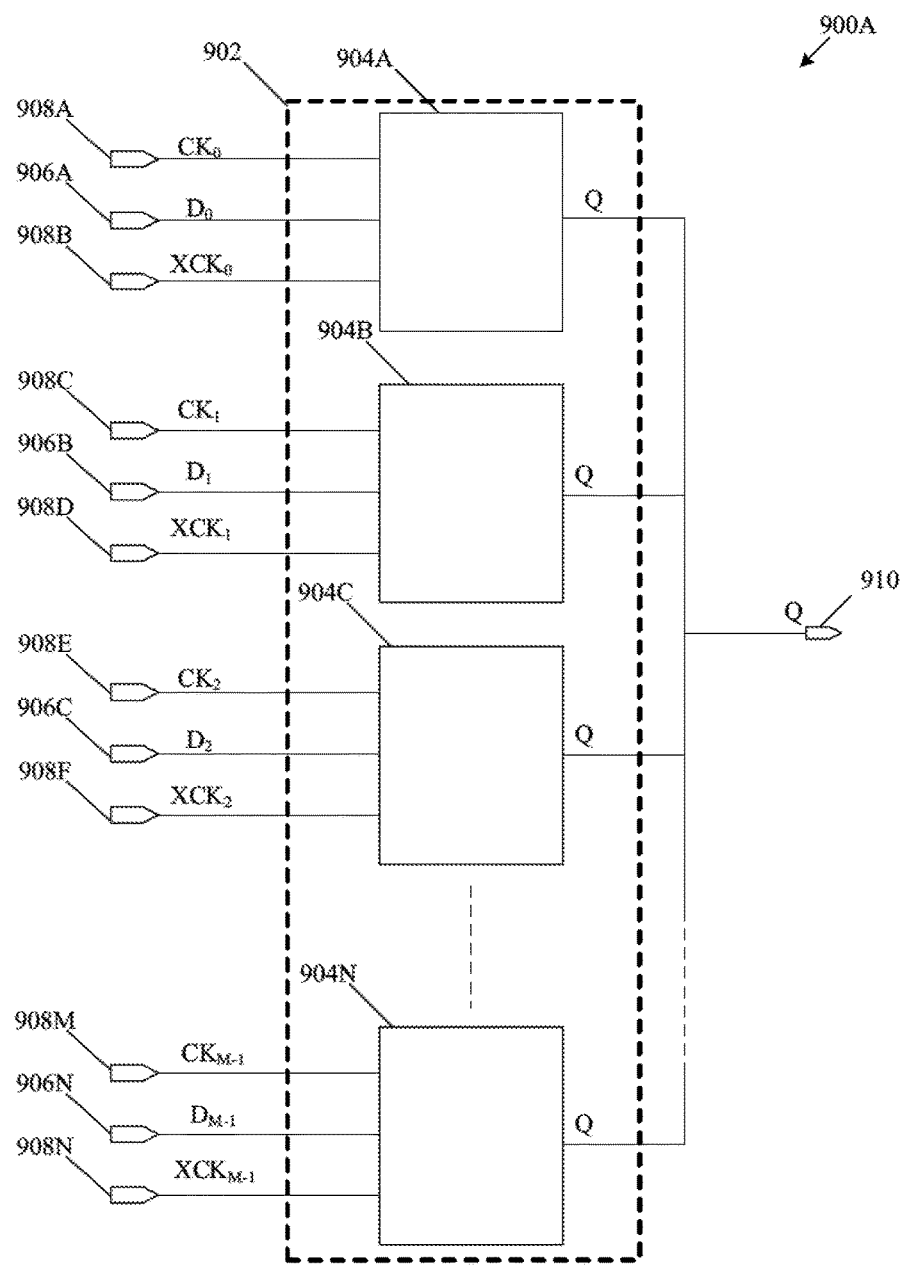
FIG. 9A is a block diagram of a parallel-to-serial (PS) converter circuit that utilizes the tri-state circuit of FIGS. 2A, 3, 4, and 5, in accordance with an embodiment of the disclosure.

FIG. 9A is a block diagram of a parallel-to-serial (PS) converter circuit that utilizes the tri-state circuit of FIGS. 2A, 3, 4, or 5, in accordance with an embodiment of the disclosure. With reference to FIG. 9A, there is shown block diagram 900A of a PS converter circuit 902. The PS converter circuit 902 may include a plurality of tri-state circuits 904A, 904B, 904C, . . . , 904N that are represented blocks in FIG. 9A.

Each tri-state circuit of the plurality of tri-state circuits 904A, 904B, 904C, . . . , 904N may functionally operate similar to the tri-state circuits 202, 302, 402, 502 of FIGS. 2A, 3, 4, or 5. Also, the functional performance and expected output states from the plurality of tri-state circuits may be same as that of FIGS. 2A, 3, 4, and 5. Thus, the detailed construction and operation of a tri-state circuit may be understood from FIGS. 2A, 3, 4, and 5.

The PS converter circuit 902 may be configured to receive a plurality of input data signals (represented by $D_0, D_1 \ldots D_{M-1}$) as parallel data signals through a plurality of input data terminals 906A, 906B, 906C, . . . , 906N of the plurality of tri-state circuits 904A, 904B, 904C, . . . , 904N, as shown. The plurality of input data signals ($D_0, D_1 \ldots D_{M-1}$) may be carried by a parallel data bus at a first input data rate. The first input data may be a stream of n-bit words (where "n" represents a number of input terminals or length of parallel input data signal that forms a digital word) with a first input data rate of "w" words/second. For example, the first input data may have an "8-bit word size" with an input data rate of "16 words per second" in a parallel configuration along "8" parallel buses (or "8" input data terminals). The input data word may be represented as $D_0, D_1, D_2 \ldots,$ and $D_{M-1}$ where M=8, in this example. The input data bits of different input data signals ($D_0$ to $D_{M-1}$) may be individually staggered in time to increase a timing margin for the selection of the bits of a word from a specific data input terminal. In some implementations, consecutively placed input data signals may be individually delayed by a duration of one bit to optimally increase a time margin for a selection of input data bits from one tri-state gate to the consecutive tri-state gate in PS converter circuit 902.

The plurality of tri-state circuits 904A, 904B, 904C, . . . , 904N may be further configured to receive a plurality of clock signals (represented by CK$_0$, XCK$_0$, CK$_1$, XCK$_1$, CK$_2$, and XCK$_2$ . . . CK$_{M-1}$, and XCK$_{M-1}$) that may be received as complementary pairs of binary logic signals. The PS converter circuit 902 may include a phased clock circuit (not shown) that may be configured to generate the plurality of clock signals (CK$_0$, XCK$_0$, CK$_1$, XCK$_1$, CK$_2$, and XCK$_2$ . . . CK$_{M-1}$, and XCK$_{M-1}$). The plurality of clock signals (CK$_0$, XCK$_0$, CK$_1$, XCK$_1$, CK$_2$, and XCK$_2$ . . . CK$_{M-1}$, and XCK$_{M-1}$) may have a phase difference that may be equal to a duration of a bit in the output data signal (represented by Q), received serially from the plurality of tri-state circuits 904A, 904B, 904C, . . . , 904N (also shown in timing diagram of FIG. 9B). The phased clock circuit may utilize an M-phase clock, where each phase of clock signal may be provided through a respective terminal of the plurality of input terminals 906A, 908B, 908C, . . . , 908N.

Each phase of a clock signal may be high ("1") for a duration of one bit only, and a phase of a clock signal $CK_x$ (where "x" may represent a position index of a clock signal received by an $X_{th}$ tri-state circuit of the PS converter circuit 902) may be high ("1") after a phase of clock signal $CK_{X-1}$ turns high ("1"). For example, for an "8-bit word" of input data signal, the phase may shift by a duration one bit sequentially from $CK_0$ to $CK_7$ and the phase of next "8 clock signals" (i.e. $CK_8$ to $CK_{15}$) may be reset to repeat the phase of $CK_0$ to $CK_7$, respectively. The plurality of clock signals ($CK_0$, $XCK_0$, $CK_1$, $XCK_1$, $CK_2$, and $XCK_2$ ... $CK_{M-1}$, and $XCK_{M-1}$) may be associated with a signal frequency that is equal to a fraction of the serialized output data rate of the serialized output data signal (represented by Q). The fraction of the output data rate (received serially) corresponds to a reciprocal of a number of tri-state circuits. As an example, the signal frequency (f) of the plurality of clock signals ($CK_0$, $XCK_0$, $CK_1$, $XCK_1$, $CK_2$, and $XCK_2$ ... $CK_{M-1}$, and $XCK_{M-1}$) may be given an expression (1), as follows:

$$f = \frac{1}{\text{Number of Tristate circuits } (N)} \times \text{Output Data Rate} \quad (1)$$

The plurality of clock signals ($CK_0$, $XCK_0$, $CK_1$, $XCK_1$, $CK_2$, and $XCK_2$ ... $CK_{M-1}$, and $XCK_{M-1}$) may generate the output data signal (Q) via a combined output terminal (represented as Q) of the plurality of tri-state circuits 904A, 904B, 904C, ..., 904N. The output data signal (Q) may be generated serially at a first output data rate based on a tri-state switching operation of the plurality of tri-state circuits 904A, 904B, 904C, ..., 904N in accordance with the received plurality of input data signals ($CK_0$, $XCK_0$, OKI, $XCK_1$, $CK_2$, and $XCK_2$ ... $CK_{M-1}$, and $XCK_{M-1}$). The first output data rate may be a product of a word size (n) with a first input data rate of "w" words/second, i.e. n*w bits per second (bps). For example, a plurality of input data signals ($D_0$ to $D_{15}$) received at an input data rate of "8 words per second", with an "16-bit word size" may be processed by a 16:1 PS converter circuit to generate output data signal (Q) at an output data rate of "128 bps" on a combined output data terminal 910. A duration of each bit in the output data signal (Q) may be synchronized with a duration of a clock signal for a tri-state gate selected for bit transfer in each clock cycle. The effect of ISI on the serially generated bits of the output data signal (Q) from the PS converter circuit 902 may be minimum. Such minimum effect of ISI is achieved by providing suitable time margin between individual input data signals and further by use of only a pair of transistors in the driver circuit 104 in each tri-state circuits of the plurality of tri-state circuits 904A, 904B, 904C, ..., 904N.

Figure 9B:
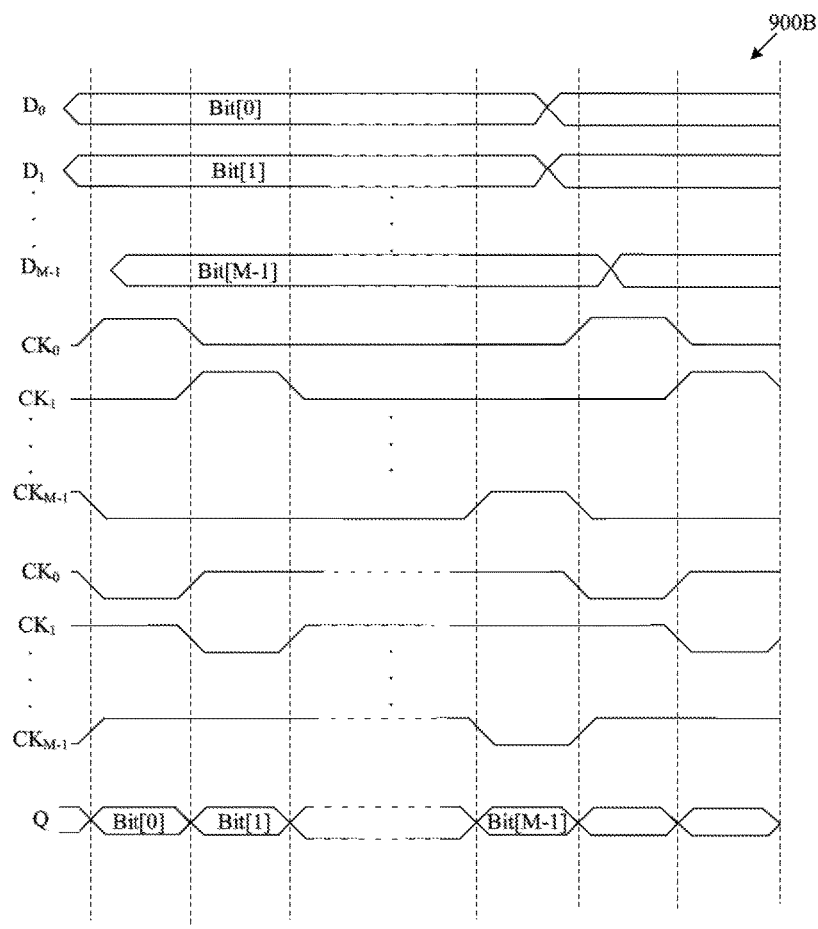
FIG. 9B is a timing diagram for operation of the PS converter circuit of FIG. 9A, in accordance with an embodiment of the disclosure.

FIG. 9B is a timing diagram for operation of the PS converter circuit of FIG. 9A, in accordance with an embodiment of the disclosure. With reference to FIG. 9B, there is shown a timing diagram 900B for the operation of the PS converter circuit 902 of FIG. 9A. The timing diagram 900B may include a chart for the plurality of input data signals (represented by $D_0$ to $D_{M-1}$), the plurality of clock signal (represented as $CK_0$ to $CK_{M-1}$), and the output data signal (represented as Q). The timing diagram 900B has been explained in FIG. 9A, in conjunction with elements of the PS converter circuit of FIG. 9A. Thus, the detailed description of the timing diagram 900B may be inferred from the description provided in FIG. 9A.

Figure 10:
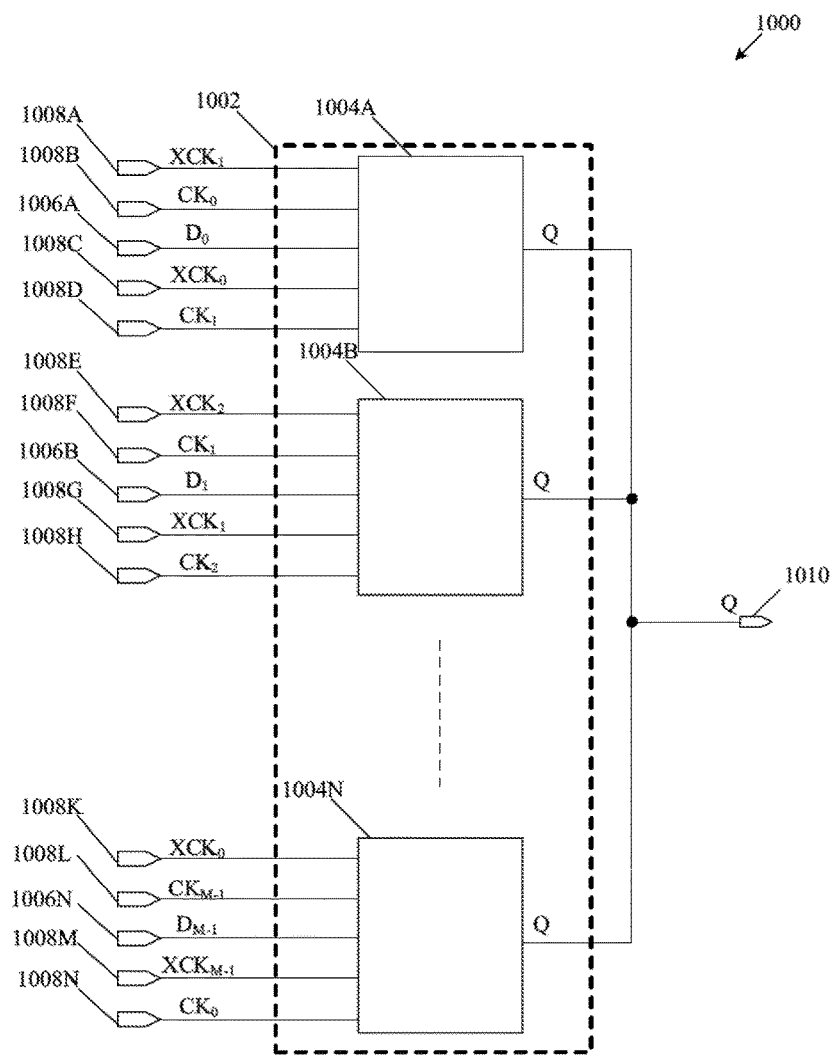
FIG. 10 is a block diagram of a parallel-to-serial (PS) converter circuit that utilizes the tri-state circuit of FIG. 6A, FIG. 7, and FIG. 8, in accordance with an embodiment of the disclosure.

FIG. 10 is a block diagram of a parallel-to-serial (PS) converter circuit that utilizes the tri-state circuit of FIGS. 6, 7, and 8, in accordance with an embodiment of the disclosure. With reference to FIG. 10, there is shown a block diagram 1000 of a PS converter circuit 1002. The PS converter circuit 1002 may be an alternative embodiment to the PS converter circuit 902 of FIG. 9A.

The PS converter circuit 1002 may include a plurality of tri-state circuits 1004A, 1004B, ..., 1004N that are represented as blocks in FIG. 10. Each tri-state circuit of the plurality of tri-state circuits 1004A, 1004B, ..., 1004N may functionally operate similar to the tri-state circuits 602, 702, or 802, of FIG. 6A, FIG. 7, and FIG. 8. Also, the functional performance and expected output states from the plurality of tri-state circuits 1004A, 1004B, ..., 1004N may be same as that the tri-state circuits 602, 702, or 802.

Each tri-state circuit (i.e., 1004A, 1004B, ..., 1004N) in the PS converter circuit 1002 may be enhanced by addition of more input terminals for a second clock signal ($CK_2$) and a second complementary clock signal ($XCK_2$) in addition to the terminals for the first clock signal ($CK_1$) and the first complementary clock signal ($XCK_1$). The PS converter circuit 1002 may be a "1 of M" selector circuit, where "1 of M" input data lines may be selected in a single clock phase. The plurality of input data signals (represented by $D_0$, $D_1$, $D_2$ ... and $D_{M-1}$) may be received via a plurality of input data terminals 1006A, 1006B, ..., 1006N.

Each tri-state circuit in the PS converter circuit 1002 may have an output port that may be combined together to obtain an output terminal 1010 (also represented by "Q"). Similar to the PS converter circuit 902 of FIG. 9A, the PS converter circuit 1002 may receive a plurality of clock signals, where different clock signals may be staggered sequentially in time by "M" different clock phases. Here, "M" may be the number of tri-state gates in the PS converter circuit 1002. The plurality of clock signals may include a plurality of first clock signals (represented by $CK_0$, $CK_1$ ... and $CK_{M-1}$) and a plurality of complementary clock signals ($XCK_0$, $XCK_1$ ... and $XCK_{M-1}$) that may be received via plurality of input terminals 1008A, 1008B, 1008C, ..., 1008N. The plurality of clock signals may be generated and phased out by one of a conventional ring oscillator, a clock divider circuit, or other signal operation circuits. The functional operation of the PS converter circuit 1002 may be same as that of the PS converter circuit 902 of FIG. 9A, without a loss of functional performance.

Figure 11A:
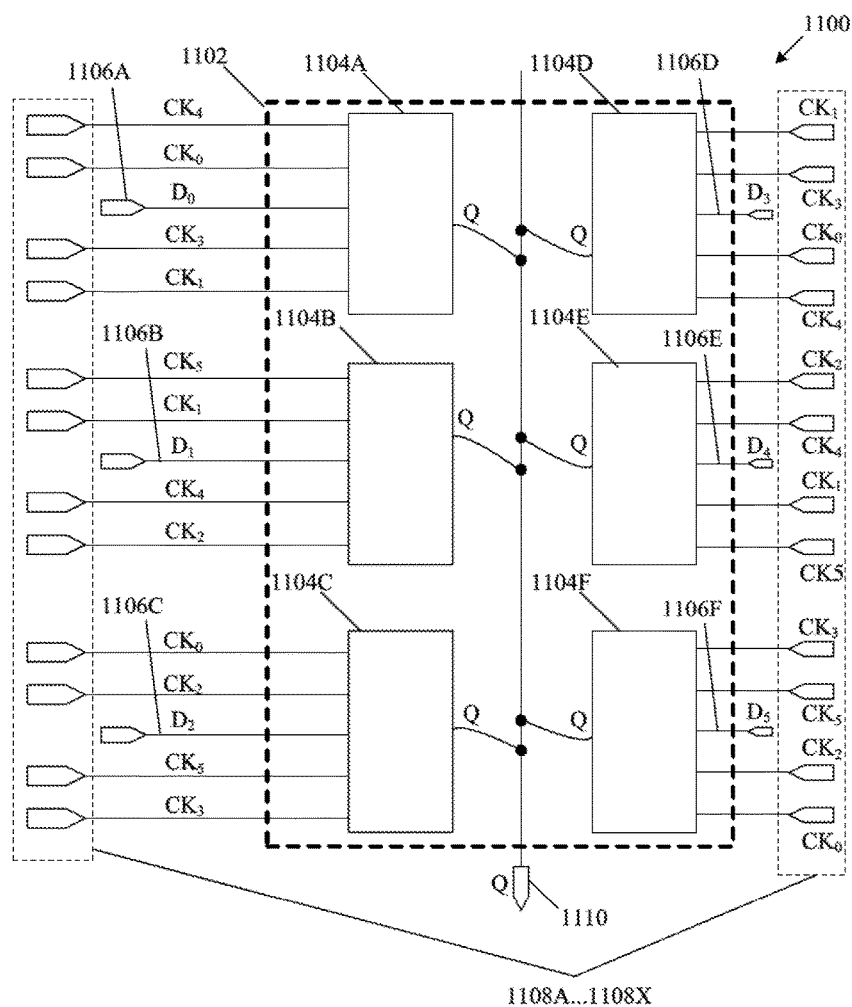
FIG. 11A is a block diagram of a 6:1 PS converter that utilizes the tri-state of FIG. 6A, FIG. 7, and FIG. 8, in accordance with an embodiment of the disclosure.

FIG. 11A is a block diagram of a 6:1 PS converter that utilizes the tri-state of FIG. 6A, FIG. 7, or FIG. 8, in accordance with an embodiment of the disclosure. With reference to FIG. 11A, there is shown a block diagram 1100 of a PS converter circuit 1102 that may include a plurality of tri-state circuits 1104A, 1104B, 1104C, ..., 1104F. The PS converter circuit 1102 is a 1 of 6 selector circuit, where a single bit is serially selected at the combined output terminal from 6 data bits at 6 different data input terminals in each clock cycle. The PS converter circuit 1102 may be explained in conjunction with the timing diagram of FIG. 11B. The PS converter circuit 1102 is a specific implementation of M:1 PS converter circuit of FIG. 10.

The PS converter circuit 1102 may be configured to receive a plurality of input data signals (represented by $D_0$, $D_1$, $D_2$, $D_3$, $D_4$, and $D_5$) via a plurality of input data terminals 1106A, 1106B, 1106C, ..., 1106F at the plurality of tri-state circuits 1104A, 1104B, 1104C, ..., 1104F. Accordingly, the PS converter circuit 1102 may be further configured to receive a plurality of clock signals (represented by $CK_0$, $CK_1$ ... $CK_5$) via a plurality of input terminals 1108A ... 1108X. The plurality of clock signals (represented by $CK_0$, $CK_1$ ... $CK_5$) may include three phases of clock signals (represented by $CK_0$, $CK_1$, and $CK_2$), another three complementary phases of the clock signals (represented by $CK_3$, $CK_4$, and $CK_5$). Each of the phase of clock signal has a low to high transition after a separation of time equivalent to a duration of 1 bit. The complementary phases of clock signals (represented by $CK_1$, $CK_3$, and $CK_5$) may be already present in the plurality of clock signals (represented by $CK_0$, $CK_1$ ... $CK_5$) when the number of tri-state circuits "M" is even in the PS converter circuit 1102.

The PS converter circuit 1102 may be further configured to generate an output data signal (represented by Q) serially at a first output data rate via a combined output terminal 1110 of the plurality of tri-state circuits 1104A, 1104B, 1104C, . . . , 1104F. The first output data rate may be a product of the word rate of input data signal received at the plurality of input data terminals 1106A, 1106B, 1106C, . . . , 1106F and a number of bits per word in the received plurality of input data signals (represented by $D_0$, $D_1$, $D_2$, $D_3$, $D_4$, and $D_5$). The output data signal (Q) may be generated based on a tri-state switching operation of the plurality of tri-state circuits 1104A, 1104B, 1104C, . . . , 1104F in accordance with the received plurality of clock signals (represented by $CK_0$, $CK_1$ ... $CK_5$).

Figure 11B:
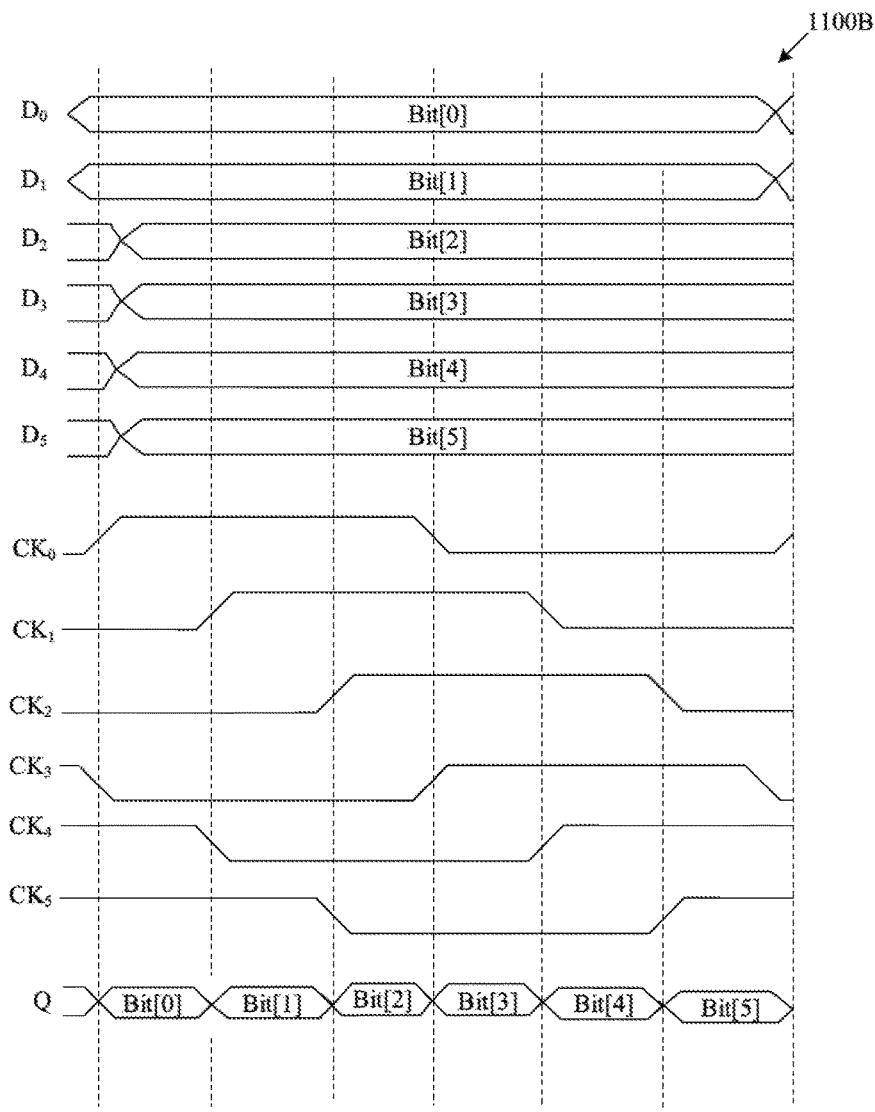
FIG. 11B is a timing diagram for operation of the PS converter circuit of FIG. 11A, in accordance with an embodiment of the disclosure.

FIG. 11B is a timing diagram to depict operation of the PS converter circuit 1102 of FIG. 11A, in accordance with an embodiment of the disclosure. With reference to FIG. 11B, there is shown a timing diagram 1100B. The timing diagram 1100B may include a chart for the plurality of input data signals (labelled from $D_0$ to $D_5$), the plurality of clock signal (represented by $CK_0$ to $CK_5$), and the output data signal (represented by Q).

The PS converter circuit 1102 may be configured to receive "6 bits", i.e. bit[0], bit[1], bit[2], bit[3], bit[4], and bit[5] in a timeframe (t), via the plurality of input data terminals 1106A,1106B,1106C, . . . , 1106F, respectively. At the same time, the PS converter circuit 1102 may be further configured to receive a 6 clock signals, i.e. $CK_0$, $CK_1$, $CK_2$, $CK_3$, $CK_4$, $CK_5$. Since, the number of bits are even, the 6 clock signals may include 3 complementary phase clock signals. At the rising edge of a first clock signal ($CK_0$), the first bit (bit[0]) at a first data terminal 1106A may be selected at the output terminal (Q). Similarly, at successive rising edge of the clock signals ($CK_1$, $CK_2$ ... $CK_5$), successive bits, i.e. bit[0], bit[1], bit[2], bit[3], bit[4], and bit[5] may be serially outputted at the combined output terminal 1110 of the PS converter circuit 1102. The received input data bits, i.e. bit[0], bit[1], bit[2], bit[3], bit[4], and bit[5] may be serially outputted in the same timeframe (t) in which a single data bit (i.e. either of bit[0], bit[1], bit[2], bit[3], bit[4], and bit[5]) may be received at any of the input data terminal.

Figure 12A:
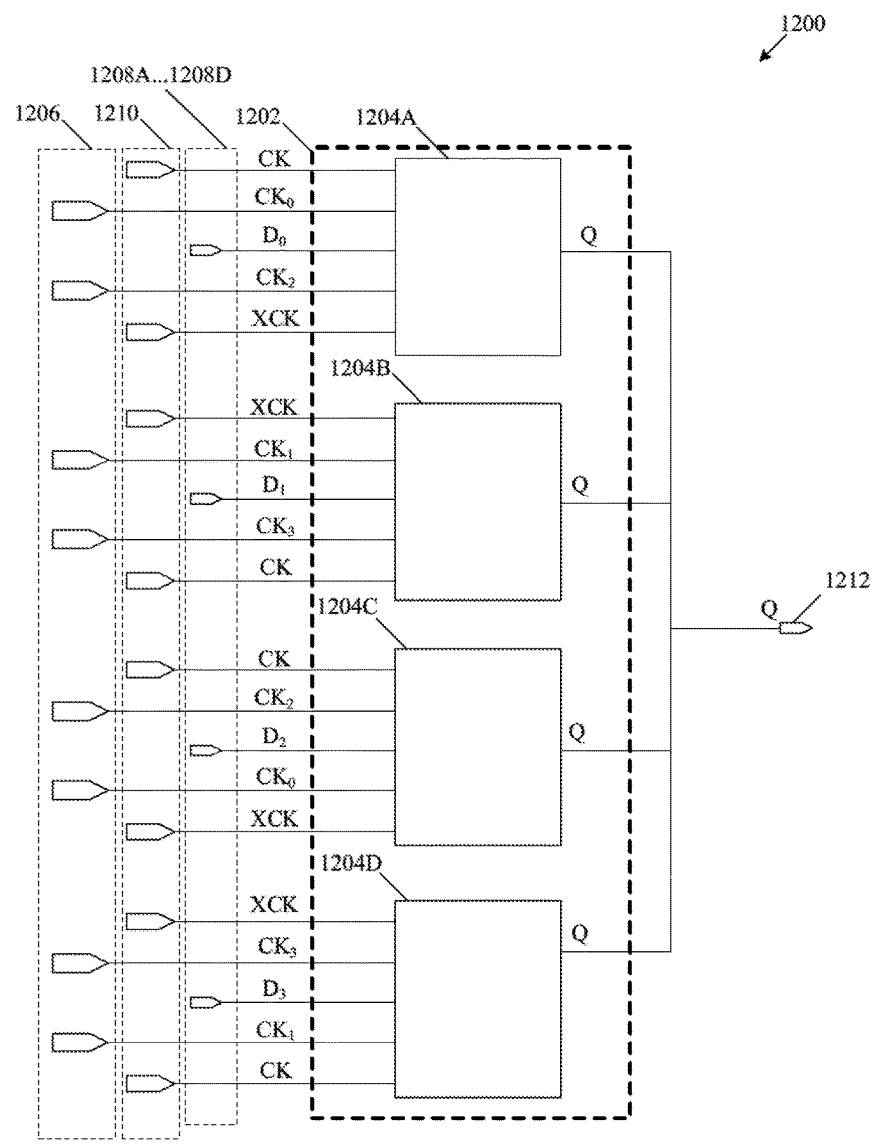
FIG. 12A is a block diagram of a 4:1 PS converter circuit that utilizes the tri-state circuit of FIG. 6A, FIG. 7, and FIG. 8 and two stage clock circuits, in accordance with an embodiment of the disclosure.

FIG. 12A is a block diagram of a 4:1 PS converter that utilizes the tri-state of FIG. 6A, FIG. 7, or FIG. 8 and a two stage clock circuit, in accordance with an embodiment of the disclosure. With reference to FIG. 12A, there is shown a block diagram 1200A of a PS converter circuit 1202 that may include a plurality of tri-state circuits 1204A,1204B, 1204C, . . . , 1204D. The PS converter circuit 1202 may be explained in conjunction with the timing diagram of FIG. 12B. The PS converter circuit 1202 is a specific case of M:1 PS converter circuit of FIG. 10.

The PS converter circuit 1202 may be a 1 of 4 selector circuit, where a single bit is serially selected at a combined output terminal from 4 data bits at 4 different data input terminals in each clock cycle. The PS converter circuit 1202 may utilize two stage clock circuits to select input data at the combined output terminal. Thus, the PS converter circuit 1202 may include a first clock circuit and a second clock circuit (not shown). The first clock circuit may be configured to generate a first plurality of phased clock signals ($CK_0$, $CK_1$, $CK_2$, and $CK_3$) at a first signal frequency. The first plurality of phase clock signals ($CK_0$, $CK_1$, $CK_2$, and $CK_3$) may correspond to quad clock signals. The first signal frequency may be equal to a reciprocal of a number of tri-state circuits' times the output data rate of the output data signal (Q). The generated first plurality of phased clock signals may be supplied to the PS converter circuit 1202 through a first plurality of input terminals 1206 at the plurality of tri-state circuits 1204A, 1204B, 1204C, . . . , 1204D, to pre-select the plurality of input data signals ($D_0$, $D_1$ ... $D_3$) received at a plurality of input data terminals 1208A ... 1208D at the PS converter circuit 1202.

The second clock circuit may be configured to generate a second plurality of phased clock signals (CK and XCK) at a second signal frequency. The first plurality of phase clock signals (CK and XCK) may correspond to half clock signals. The second signal frequency may be equal to half the output data rate of the output data signal (Q) from the PS converter circuit 1202. The generated second plurality of phased clock signals (CK and XCK) may be supplied to the PS converter circuit 1202 through a second plurality of input terminals 1210. The generated second plurality of phased clock signals (CK and XCK) may be utilized to select one data bit of the output data signal (Q) at an output data terminal 1212, from a plurality of input bits of the plurality of input data signals ($D_0$, $D_1$ ... $D_3$). Other functional operation of the PS converter circuit 1202 may be same as that of the PS converter circuit of FIG. 9A and FIG. 10 for 4 data terminals, without a loss of functional performance.

Figure 12B:
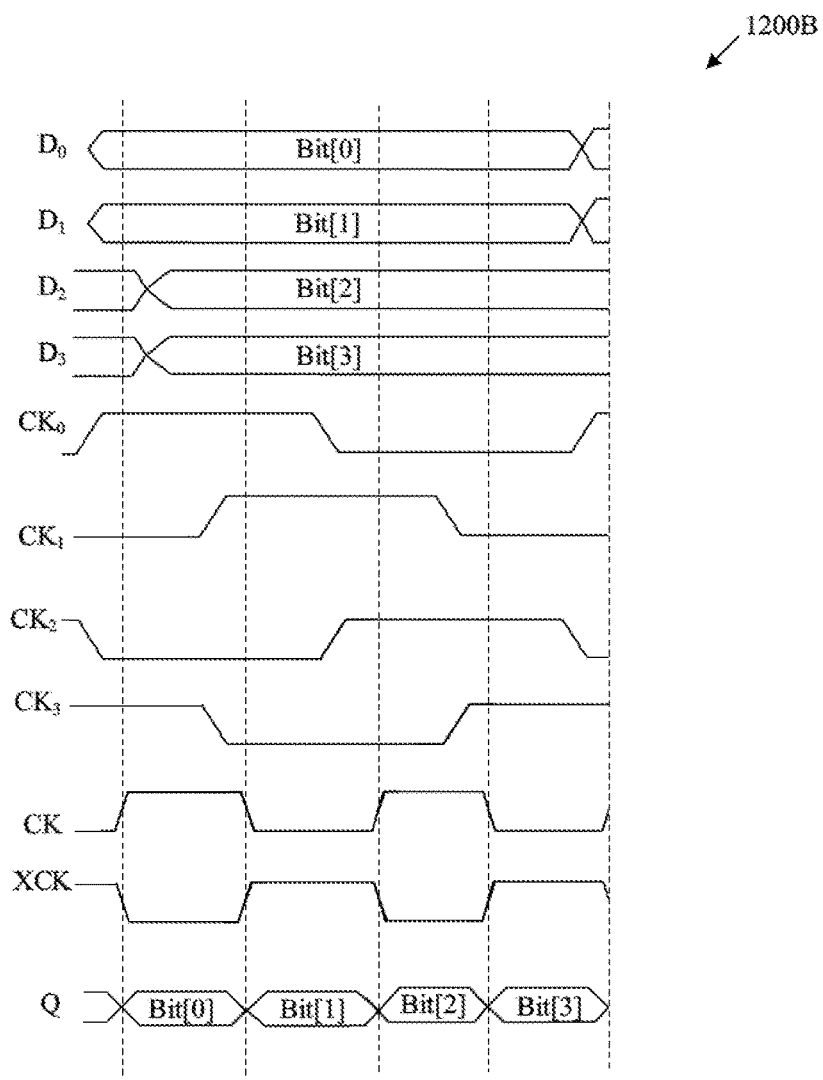
FIG. 12B is a timing diagram for operation of the PS converter circuit of FIG. 12A, in accordance with an embodiment of the disclosure.

FIG. 12B is a timing diagram to depict operation of the PS converter circuit of FIG. 12A, in accordance with an embodiment of the disclosure. With reference to FIG. 12B, there is shown a timing diagram 1200B for the operation of the PS converter circuit 1202. The timing diagram 1200B may be explained in conjunction with the operation of the PS converter circuit 1202 of FIG. 12A.

The PS converter circuit 1202 may be configured to receive a 4-bit input word (i.e. Bit[0], Bit[1], Bit[2], and Bit[3]) through a plurality of input data terminals 1208A ... 1208D. The PS converter circuit 1202 receives two different types of clock signals from the first clock circuit and the second clock circuit, in addition to 4 phased clock signals (M=4). The frequency of the 4 phased clock signals may be associated with a signal frequency that is ¼ of the output data rate. The 4 phased clock signals may be received as $CK_0$, $CK_1$, $CK_2$, and $CK_3$ to pre-select the plurality of input data signals (received as $D_0$, $D_1$, $D_2$, and $D_3$).

The 4 phased clock signals may be followed by a 2 phased clock signals received through CK and XCK, with a signal frequency that is similar to that of the output data signal (Q). The Bit[0] may emerge at the combined output terminal, when the phased clock signal at $CK_0$ is high and the phased clock signal at CK is high. Similarly, the Bit[1] may emerge at the combined output terminal when the phased clock signal at $CK_1$ is high and the phased clock signal at XCK is high. The output timing may be significantly dependent on two phased clock signals (received through CK and XCK) from the first clock circuit and the second clock circuit.

Figure 13:
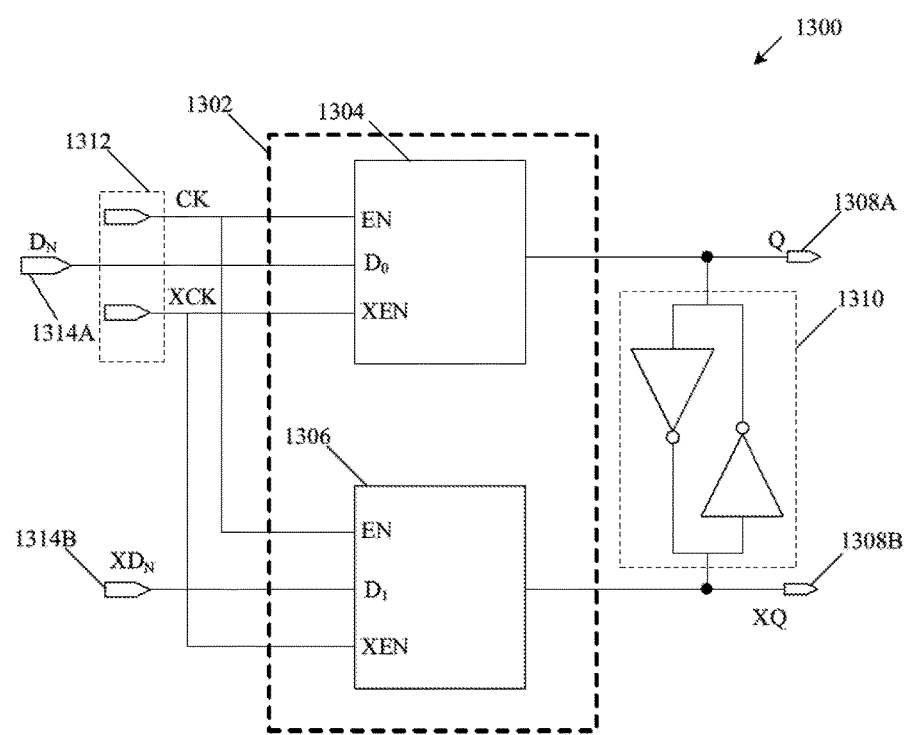
FIG. 13 is a block diagram of a latch circuit that utilizes tri-state circuits of FIG. 2A, FIG. 3, FIG. 4, and FIG. 5, in accordance with an embodiment of the disclosure.

FIG. 13 is a block diagram of a latch circuit that utilizes tri-state circuits of FIG. 2A, FIG. 3, FIG. 4, or FIG. 5, in accordance with an embodiment of the disclosure. With reference to FIG. 13, there is shown a block diagram 1300 of a latch circuit 1302. The latch circuit 1302 may include two tri-state circuits, such as a first tri-state circuit 1304 and a second tri-state circuit 1306. The first tri-state circuit 1304 and the second tri-state circuit 1306 may have a pair of complementary output terminals 1308A and 1308B cross-coupled with a pair of inverter circuits 1310.

The first tri-state circuit 1304 and the second tri-state circuit 1306 may be concurrently enabled or disabled based on a plurality of clock signals. For example, a clock signal and a complementary clock signal that may be received via the plurality of input terminals 1312. The cross-coupled pair of inverter circuits 1310 may be configured to provide a positive feedback to enhance a latching behavior of the latch circuit 1302. The latch circuit 1302 may be configured to receive an input data signal ($D_N$) and a complementary input data signal ($XD_N$) via a first input data terminal 1314A and a second input data terminal 1314B, respectively. The latch circuit 1302 may be configured to generate a pair of complementary latched outputs (Q and XQ) via the pair of complementary output terminals 1308A and 1308B.

The latch circuit 1302 may be configured to provide the output data signal (as Q and XQ) that is same as the input data signal (at $D_N$ and $XD_N$) when the clock signal at "CK" is high and the complementary clock signal at "XCK" is low. Alternatively, the latch circuit 1302 may be configured to hold the state of the output data signal (at Q and XQ) irrespective of the state of the input data signal at $D_N$ and $XD_N$ when the clock signal at CK is low and the complementary clock signal at XCK is high.

The two tri-state circuits in the latch circuit 1302 may functionally operate similar to the tri-state circuit of FIG. 2A, FIG. 3, FIG. 4, or FIG. 5. Also, the functional performance and expected output states from the two tri-state circuits may be same as that of FIG. 2A, FIG. 3, FIG. 4, or FIG. 5. Thus, the detailed construction and operation of the two tri-state circuits has been omitted from the disclosure for the sake of brevity. The latch circuit 1302 utilizes modified tri-state circuits (for example, the tri-state circuit of FIG. 2A, 3, 4, 5, 6A, 7, or 8) that are performance optimized for minimum effect of ISI on the latched output data from the latch circuit 1302. Therefore, the minimized ISI at a load coupled to the latch circuit 1302 may ensure that data integrity and expected output data rates are maintained for digital logic circuits (for example, the PS converter circuit of FIGS. 9A, 10, 11A, or 12A and the memory circuit of FIG. 14 and FIG. 15A) that utilizes the latch circuit 1302.

Figure 14:
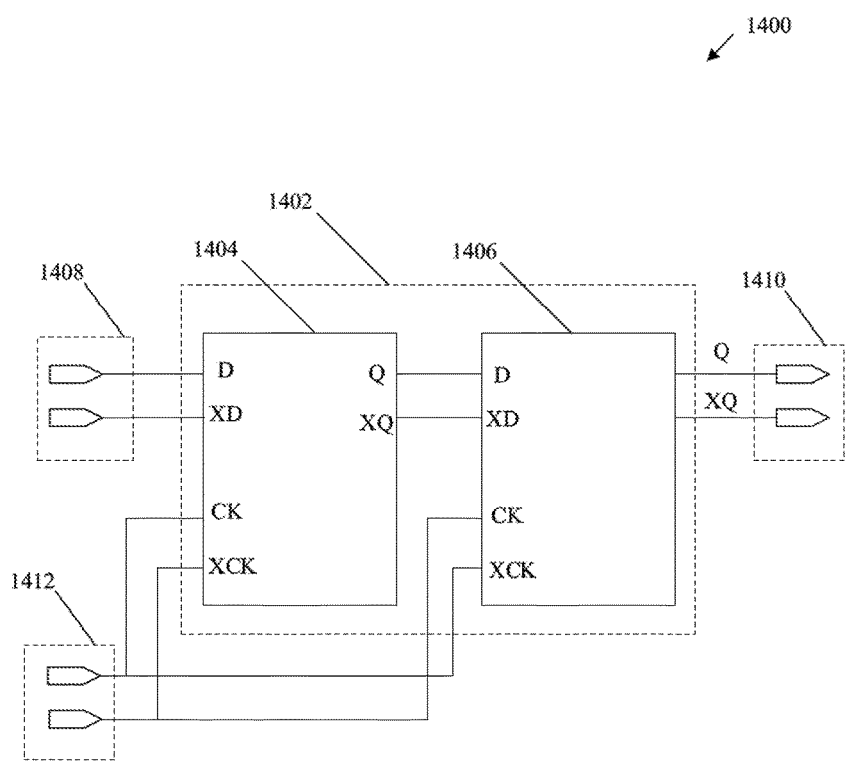
FIG. 14 is a block diagram of a flip flop circuit that utilizes two latch circuits in a master and a slave configuration, in accordance with an embodiment of the disclosure.

FIG. 14 is a block diagram of a flip flop circuit that utilizes two latch circuits of FIG. 13, in accordance with an embodiment of the disclosure. With reference to FIG. 14, there is shown a block diagram 1400 of the flip flop circuit 1402. The flip flop circuit 1402 is a memory circuit that includes a plurality of latch circuits 1404 and 1406 coupled in a master and slave configuration. More specifically, the flip flop circuit 1402 may include a master latch circuit 1404 and a slave latch circuit 1406 coupled to the master latch circuit 1404.

The plurality of latch circuits 1404 and 1406 coupled to each other in the master and slave configuration may be utilized as a complementary data (D) flip flop circuit (i.e., D-type flip flop circuit) to latch a plurality of input data bits in accordance with a plurality of clock signals (CK and XCK). The plurality of input data bits may be received as complementary input data bits ($D_N$ and $XD_N$) at input data terminals 1408 of the master latch circuit 1404. Each latch circuit may be configured to stagger a pair of complementary data bits in time to set a time margin for selection of an input data bit at output terminals 1410, from a plurality of input data signals ($D_N$ and $XD_N$) in accordance with a plurality of clock signals (CK and XCK).

The master latch circuit 1404 and the slave latch circuit 1406 may share the same complementary clock signals (labelled CK and XCK) received through input terminals 1412 of the master latch circuit 1404 and the slave latch circuit 1406. The complementary output terminals of the master latch circuit 1404 may be coupled to the complementary input terminals of the slave latch circuit 1406. Thus, the output data bits from the master latch circuit 1404 may be inputted to the slave latch circuit 1406. The master latch circuit 1404 and the slave latch circuit may functionally operate similar to the latch circuit of FIG. 13. Also, the functional performance and expected output states from the master latch circuit 1404 and the slave latch circuit 1406 may be same as that of FIG. 13.

Figure 15A:
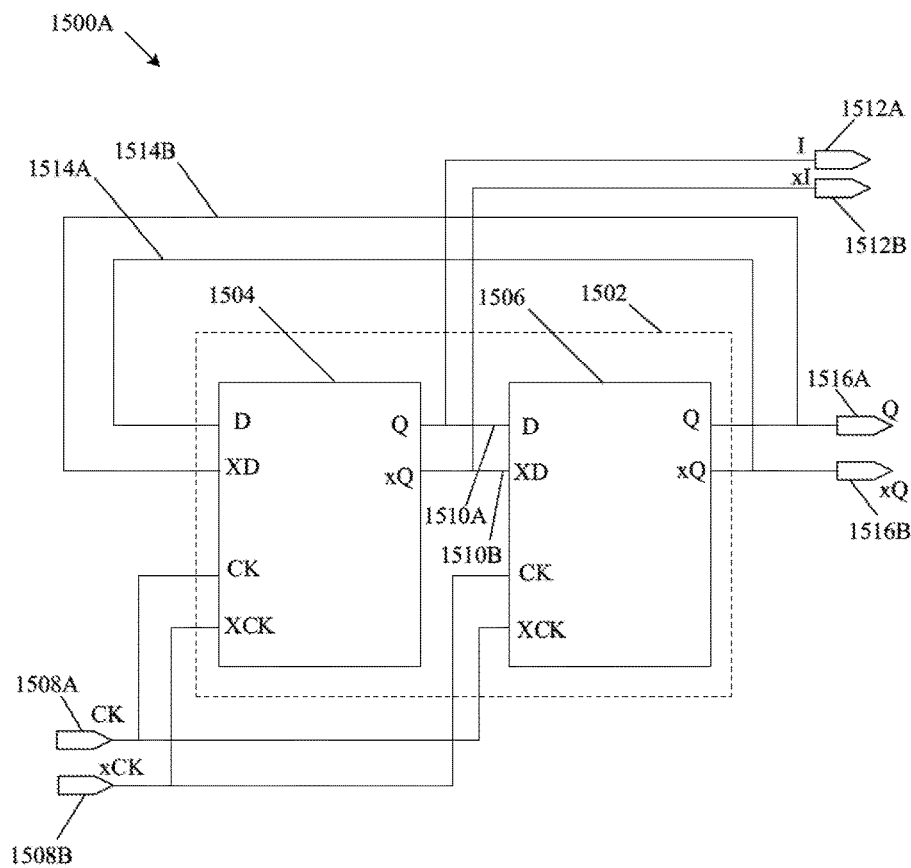
FIG. 15A is a block diagram of a divider circuit that utilizes two latch circuits in a master and a slave configuration, in accordance with an embodiment of the disclosure.

FIG. 15A is a block diagram of a divider circuit that utilizes two latched circuits in a master and a slave configuration, in accordance with an embodiment of the disclosure. With reference to FIG. 15A, there is shown a block diagram 1500A of a divider circuit 1502. The divider circuit 1502 is a complementary quadrature divide by "2" circuit that may be realized using the latch circuit 1302 of FIG. 13. The divider circuit 1502 is a memory circuit that may include a plurality of latch circuits coupled in a master and slave configuration. More specifically, the divider circuit 1502 may include a master latch circuit 1504 and a slave latch circuit 1506 coupled to the master latch circuit 1504.

The master latch circuit 1504 and the slave latch circuit 1506 may share same complementary clock signals (labelled CK and XCK) received through input terminals 1508A and 1508B. The master latch circuit 1504 may have a pair of complementary output terminals of 1510A and 1510B that may be coupled to the complementary input terminals of the slave latch circuit 1506. An in-phase (represented by i) signal and a complement signal (represented by xi) may be provided by the master latch circuit 1504 through a pair of terminals 1512A and 1512B. The master latch circuit 1504 may have a pair of input data terminals 1514A and 1514B that may be coupled with a pair of complementary output data terminals 1516A and 1516B of the slave latch circuit 1506. In some embodiments, the divider circuit 1502 may be used to generate true and complementary clock phases for a "1 of M" selector circuit of FIG. 9A.

The master latch circuit 1504 and the slave latch circuit 1506 may functionally operate similar to the latch circuit 1302 of FIG. 13. Also, the functional performance and expected output states from the master latch circuit 1504 and the slave latch circuit 1506 may be same as that of FIG. 13.

Figure 15B:
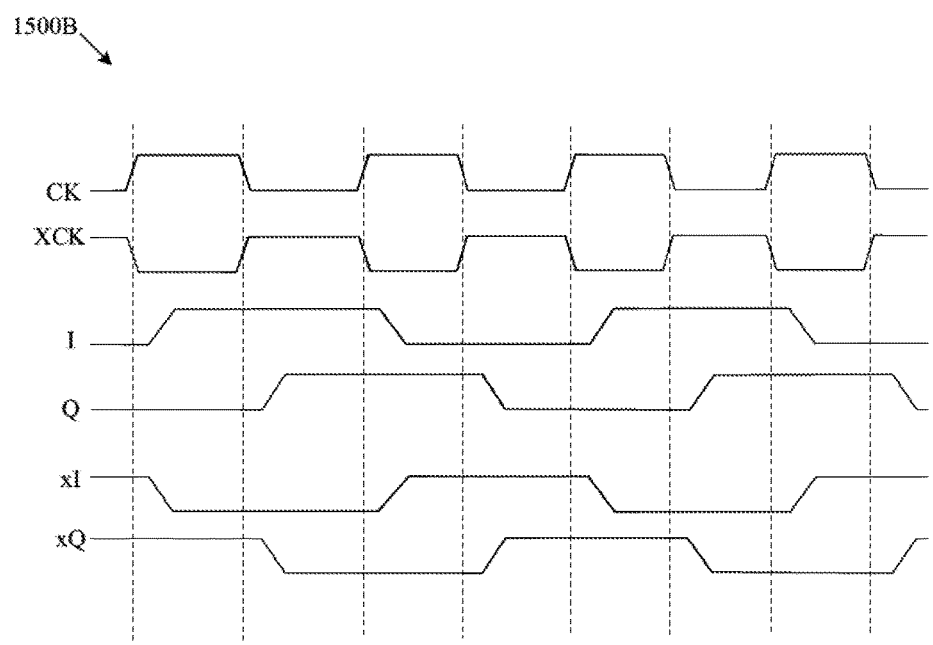
FIG. 15B is a timing diagram for an operation of the divider circuit of FIG. 15A, in accordance with an embodiment of the disclosure.

FIG. 15B is a timing diagram for an operation of the divider circuit of FIG. 15A, in accordance with an embodiment of the disclosure. FIG. 15B may be explained in conjunction with elements from FIG. 15A. With reference to FIG. 15B, there is shown a timing diagram 1500B of the divider circuit 1502 of FIG. 15A.

With reference to the timing diagram 1500B, the plurality of input data bits may be received as complementary input data bits ($D_N$ and $XD_N$) at the pair of input data terminals 1514A and 1514B of the master latch circuit 1504. Each of the master latch circuit 1504 and the slave latch circuit 1506 may be configured to stagger a pair of complementary data bits in time to set a time margin for selection of an input data bit from the plurality of input data signals ($D_N$ and $XD_N$) in accordance with a plurality of clock signals (CK and XCK). The master latch circuit 1504 may be configured to provide an in-phase and complement signal (represented by "i" and "xi") and the slave latch circuit 1506 may be configured to provide a quadrature and a complement signal (represented by "Q" and "xQ").

Figure 16:
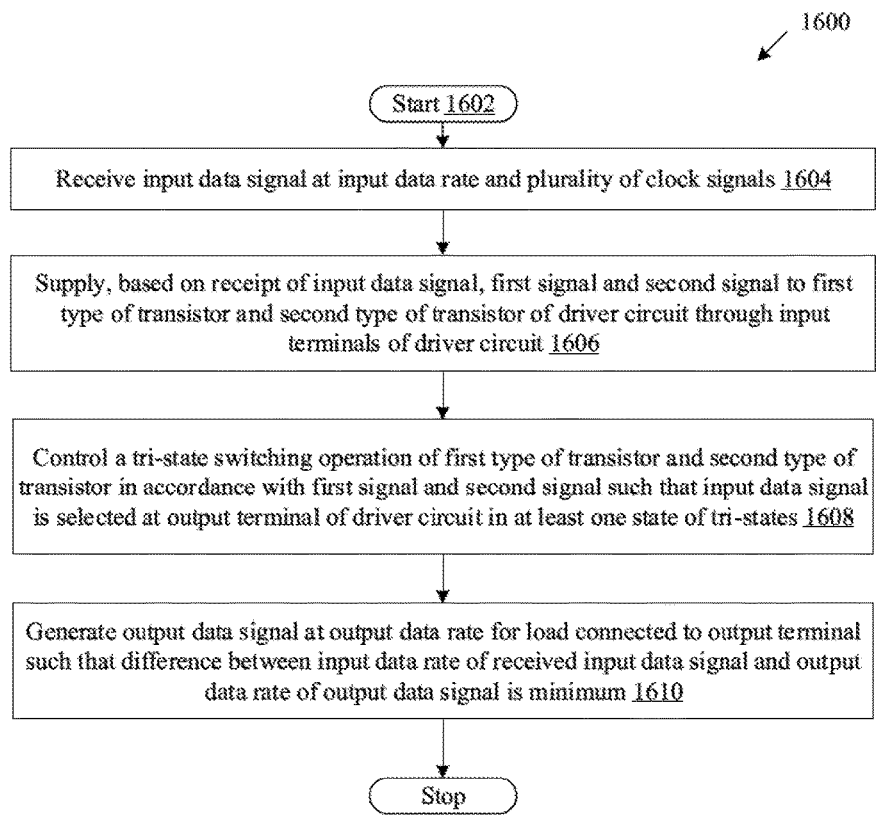
FIG. 16 is a flowchart that illustrates a method for generation of output data signal from an input data signal by a tri-state circuit, in accordance with an embodiment of the disclosure.

FIG. 16 is a flowchart that illustrates a method for generation of output data signal from an input data signal at a tri-state circuit, in accordance with an embodiment of the disclosure. FIG. 16 may be explained in conjunction with elements from FIGS. 1, 2A, 2B, 3, 4, 5, 6A, 6B, 7, 8, 9A, 9B, 10, 11A, 11B, 12A, 12B, 13, 14, 15A, and 15B. With reference to FIG. 16, there is shown a flowchart 1600. The method starts at 1602 and proceeds to 1604.

At 1604, an input data signal and a plurality of clock signals may be received at an input data rate. The control circuit 106 in the tri-state circuit 102 may be configured to receive the input data signal at an input data rate and a plurality of clock signals.

At 1606, based on the receipt of the input data signal, a first signal and a second signal may be supplied to the first type of transistor 108A and the second type of transistor 108B of the driver circuit 104 through the input terminals 110A and 110B of the driver circuit 104. The control circuit 106 in the tri-state circuit 102 may be configured to supply the first signal and the second signal to the first type of transistor 108A and the second type of transistor 108B of the driver circuit 104 through the input terminals 110A and 110B of the driver circuit 104, in response to the receipt of the input data signal.

At 1608, a tri-state switching operation of the first type of transistor 108A and the second type of transistor 108B may be controlled in accordance with the first signal and the second signal such that the input data signal is selected at the output terminal 112 of the driver circuit 104 in at least one state of the tri-state switching operation. The control circuit 106 may be configured to control the tri-state switching operation of the first type of transistor 108A and the second type of transistor 108B in accordance with the first signal and the second signal. The tri-state switching operation may be controlled such that the input data signal is selected at the output terminal 112 of the driver circuit 104 in at least one state of the tri-state switching operation. An example of the tri-state switching operation is described in FIGS. 2B and 6B.

At 1610, an output data signal may be generated at an output data rate for the load 118 connected to the output terminal 112 such that a difference between the input data rate of the received input data signal and the output data rate of the output data signal is minimum. The driver circuit 104 may be configured to generate an output data signal at an output data rate for the load 118 connected to the output terminal 112. The output data signal may be generated such that a difference between the input data rate of the received input data signal and the output data rate of the output data signal is minimum. Control passes to end.

Figure 17:
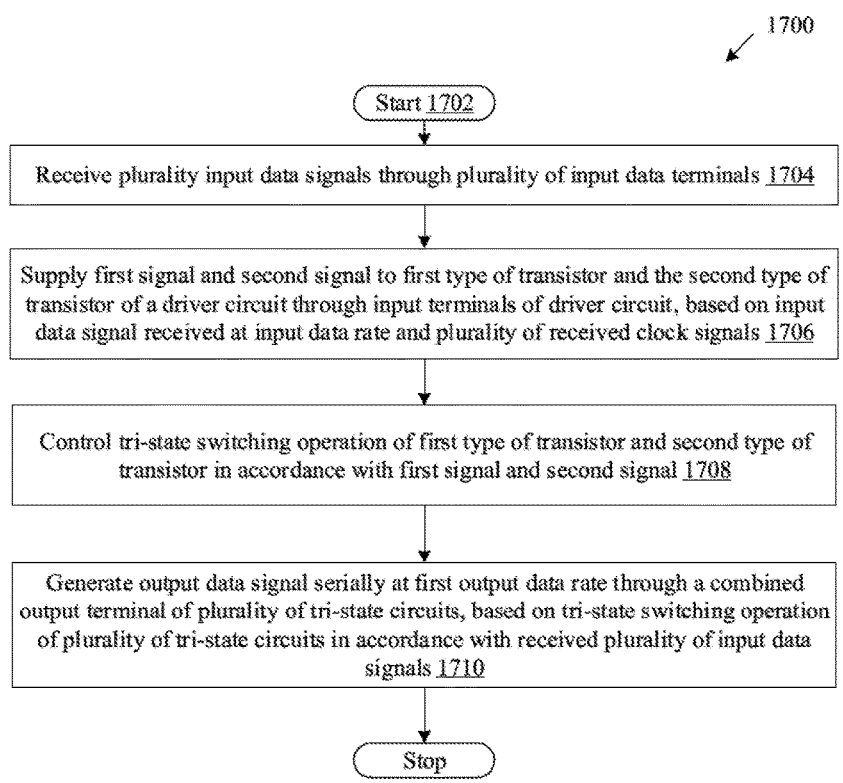
FIG. 17 is a flowchart that illustrates a method for selection of an input data signal from a plurality of parallel input signals at PS converter circuit that utilizes the tri-state circuit of FIGS. 2A, 3, 4, 5, 6A, 7, or 8, in accordance with an embodiment of the disclosure.

FIG. 17 is a flowchart that illustrates a method for selection of an input data signal from a plurality of parallel input signals at a PS converter circuit that utilizes the tri-state circuit of FIGS. 2A, 3, 4, 5, 6A, 7, or 8, in accordance with an embodiment of the disclosure. FIG. 17 has been explained in conjunction with elements from FIGS. 1, 2A, 2B, 3, 4, 5, 6A, 6B, 7, 8, 9A, 9B, 10, 11A, 11B, 12A, 12B, 13, 14, 15A, 15B, and 16. With reference to FIG. 17, there is shown a flowchart 1700. The method starts at 1702 and proceeds to 1704.

At 1704, a plurality of input data signals may be received in parallel at a first input data rate. The PS converter circuits 902, 1002, 1102, or 1202 may be configured to receive the plurality of input data signals through the plurality of input data terminals.

At 1706, a first signal and a second signal may be supplied to the first type of transistor 108A and the second type of transistor 108B of the driver circuit through the input terminals of the driver circuit, based on an input data signal received at an input data rate and a plurality of received clock signals. The control circuit 106 in each of the plurality of tri-state circuits may be configured supply the first signal and the second signal to the first type of transistor 108A and the second type of transistor 108B of the driver circuit 104 through the input terminals of the driver circuit 104, based on an input data signal received at an input data rate and a plurality of received clock signals.

At 1708, the tri-state switching operation of the first type of transistor 108A and the second type of transistor 108B may be controlled in accordance with the first signal and the second signal. The tri-state switching operation may be controlled such that the input data signal is selected at the output terminal of the driver circuit in at least one state in the tri-state switching operation. The control circuit 106 may be configured to control the tri-state switching operation of the first type of transistor 108A and the second type of transistor 108B in accordance with the first signal and the second signal.

At 1710, an output data signal may be generated serially at a first output data rate through a combined output terminal of the plurality of tri-state circuits, based on a tri-state switching operation of the plurality of tri-state circuits in accordance with the received plurality of input data signals. The PS converter circuit 902, 1002, 1102, or 1202 may be configured to generate an output data signal serially at a first output data rate through a combined output terminal of the plurality of tri-state circuits, based on a tri-state switching operation of the plurality of tri-state circuits in accordance with the received plurality of input data signals. Control passes to end.

In one aspect, certain embodiments of the present disclosure may be found in a tri-state circuit (for example, the tri-state circuits 102, 202, 302, 402, 502, 602, 702, or 802) for use with different types of digital circuits. The tri-state circuit may include the driver circuit 104 that may include a first type of transistor (for e.g., the first type of transistor 108A) connected in series with a second type of transistor (for e.g., the second type of transistor 108B) and an output terminal (for e.g., the output terminal 112) that may be coupled to a node (for e.g., the node 120) present in a connection between the first type of transistor and the second type of transistor. The tri-state circuit may further include the control circuit 106 that may be coupled to input terminals (for e.g., the input terminals 110A and 110B) of the driver circuit. The control circuit may be configured to receive an input data signal at an input data rate and a plurality of clock signals. In response to the receipt of the input data signal at the input data rate and the plurality of clock signals, the control circuit may be further configured to supply a first signal and a second signal to the first type of transistor and the second type of transistor of the driver circuit through the input terminals of the driver circuit. The control circuit may be further configured to control a tri-state switching operation of the first type of transistor and the second type of transistor in accordance with the first signal and the second signal. The tri-state switching operation may be controlled such that the input data signal is selected at the output terminal of the driver circuit in at least one state of the tri-state switching operation. Thereafter, the driver circuit may be configured to generate an output data signal at an output data rate for a load (for e.g., the load 118) connected to the output terminal such that a difference between the input data rate of the received input data signal and the output data rate of the output data signal is minimum.

In accordance with an embodiment, the output data rate of the output data signal is based on a transient response time to charge a combined self-loading capacitance of the first type of transistor and the second type of transistor. The difference between the input data rate of the input data signal and the output data rate of the output data signal is a minimum, based on a charge time and a discharge time for the combined self-loading capacitance of the first type of transistor and the second type of transistor of the driver circuit. The charge time and the discharge time for the combined self-loading capacitance of the first type of transistor and the second type of transistor may be further synchronized with a duration of a falling edge or a rising edge of the plurality of clock signals.

In accordance with an embodiment, the charge time and the discharge time for the combined self-loading capacitance of the first type of transistor and the second type of transistor may be based on an amplitude of a drive current generated by the driver circuit to the load through the output terminal. The drive current for the load coupled to the output terminal is based on a number of the first type of transistor and the second type of transistor in a serial network of the driver circuit.

In accordance with an embodiment, the first type of transistor may be coupled to a power supply in a pull-up configuration and the second type of transistor is coupled to a reference ground in a pull-down configuration. In certain cases, the first type of transistor may be a p-type metal-oxide semiconductor (MOS) transistor and the second type of transistor is an n-type MOS transistor.

In accordance with an embodiment, the control circuit may include a NAND gate and a NOR gate. An output terminal of the NAND gate and the NOR gate is coupled to the driver circuit through the input terminals of the driver circuit. A set of input terminals of the NAND gate and the NOR gate are configured to receive the input data signal and the plurality of clock signals.

In accordance with an embodiment, the control circuit may include an AND gate and an OR gate. An output terminal of the AND gate and the OR gate is coupled to the driver circuit through the input terminals of the driver circuit. A set of input terminals of the AND gate and the OR gate are configured to receive the input data signal and the plurality of clock signals.

In accordance with an embodiment, the control circuit may include a plurality of first type of transistors and a plurality of second type of transistors arranged in accordance with a type of network configuration. The type of network configuration may specify an interconnection of different terminals of the plurality of first type of transistors and the plurality of second type of transistors to each other and to the input terminals of the driver circuit.

In accordance with an embodiment, the control circuit may include a pair of NAND and NOR gates coupled to the driver circuit through the input terminals of the driver circuit. The control circuit may further include a pair of AND and OR gates coupled to the pair of NAND and NOR gates in a cascaded configuration. A set of input terminals of the pair of AND and OR gates may include different terminals that may be configured to receive the input data signal and the plurality of clock signals.

In accordance with an embodiment, the plurality of clock signals may include a plurality of first clock signals and a plurality of second clock signals that may be complementary in phase to the plurality of first clock signals. The tri-state circuit may be switched between an open circuit high impedance mode and a closed circuit low impedance mode, in accordance with a rising edge or a falling edge of the plurality of clock signals. The open circuit high impedance mode and the closed circuit low impedance mode may occur during the tri-state switching operation of the first type of transistor and the second type of transistor in the driver circuit.

In another aspect, certain embodiments of the present disclosure may be found in a parallel-to-serial (PS) converter circuit (for e.g., the PS converter circuit 902, 1002, 1102, or 1202). The parallel-to-serial converter circuit may include a plurality of tri-state circuits (for e.g., the plurality of tri-state circuits 902A, 902B, 902C, . . . , 902N). The plurality of tri-state circuits may be configured to receive a plurality of input data signals in parallel at a first input data rate through a plurality of input data terminals (for e.g., the plurality of input data terminals 906A, 906B, 906C . . . 906N) of the plurality of tri-state circuits. The plurality of tri-state circuits may generate an output data signal serially at a first output data rate through a combined output terminal (for e.g., the output data terminal 910) of the plurality of tri-state circuits. The output data signal may be generated serially based on a tri-state switching operation of the plurality of tri-state circuits in accordance with the received plurality of input data signals. Each tri-state circuit of the plurality of tri-state circuits may include a driver circuit, which may include a first type of transistor connected in series with a second type of transistor and an output terminal that may be coupled to a node present in a connection between the first type of transistor and the second type of transistor. The tri-state circuit may further include a control circuit that may be coupled to input terminals of the driver circuit. The control circuit may be configured to receive an input data signal at an input data rate and a plurality of clock signals. In response to the receipt of the input data signal at the input data rate and the plurality of clock signals, the control circuit may be further configured to supply a first signal and a second signal to the first type of transistor and the second type of transistor of the driver circuit through the input terminals of the driver circuit. The control circuit may be further configured to control a tri-state switching operation of the first type of transistor and the second type of transistor in accordance with the first signal and the second signal. The tri-state switching operation may be controlled such that the input data signal is selected at the output terminal of the driver circuit in at least one state of the tri-state switching operation. Thereafter, the driver circuit may be configured to generate an output data signal at an output data rate for a load connected to the output terminal such that a difference between the input data rate of the received input data signal and the output data rate of the output data signal is minimum.

In accordance with an embodiment, the plurality of clock signals may include a plurality of first clock signals and a plurality of second clock signals complementary in phase to the plurality of first clock signals. In some cases, the parallel-to-serial converter circuit may further include a phased clock circuit. The phase clock circuit may be configured to generate the plurality of clock signals that have a phase difference equal to the duration of a bit in the output data signal. The plurality of clock signals may be further associated with a signal frequency that is equal to a fraction of the output data rate of the output data signal from the parallel-to-serial converter circuit. The fraction of the output data rate may correspond to a reciprocal of a number of tri-state circuits in the parallel-to-serial converter circuits.

In accordance with an embodiment, the parallel-to-serial converter circuit may further include a first clock circuit and a second clock circuit. The first clock circuit may be configured to generate a first plurality of phased clock signals at a first signal frequency that may be equal to a reciprocal of a number of tri-state circuits times the output data rate from the parallel-to-serial converter circuit. The generated first plurality of phased clock signals may be utilized to pre-select the plurality of input data signals. Similarly, the second clock circuit may be configured to generate a second plurality of phased clock signals at a second signal frequency that may be equal to half the output data rate from the parallel-to-serial converter circuit. The generated second plurality of phased clock signals may be utilized to select one data bit of the output data signal from a plurality of input bits of the plurality of input data signals.

In yet another aspect, certain embodiments of the present disclosure may be found in a memory circuit (for example, the flip flop circuit 1402 or the divider circuit 1502). The memory circuit may include a plurality of latch circuits (for example, the latch circuit 1302) coupled in a master and slave configuration. Each latch circuit may include two tri-state circuits that have a pair of complementary output terminals (for e.g., the pair of complementary output terminals 1308A and 1308B) cross-coupled with a pair of inverter circuits (for example, the pair of inverter circuits 1310). Each latch circuit may be configured to stagger a pair of complementary data bits in time to set a time margin for selection of an input data bit from a plurality of input data signals in accordance with a plurality of clock signals. Each tri-state circuit of the two tri-state circuits may include a driver circuit, which may include a first type of transistor connected in series with a second type of transistor and an output terminal that may be coupled to a node present in a connection between the first type of transistor and the second type of transistor. The tri-state circuit may further include a control circuit that may be coupled to input terminals of the driver circuit. The control circuit may be configured to receive an input data signal at an input data rate and a plurality of clock signals. In response to the receipt of the input data signal at the input data rate and the plurality of clock signals, the control circuit may be further configured to supply a first signal and a second signal to the first type of transistor and the second type of transistor of the driver circuit through the input terminals of the driver circuit. The control circuit may be further configured to control a tri-state switching operation of the first type of transistor and the second type of transistor in accordance with the first signal and the second signal. The tri-state switching operation may be controlled such that the input data signal is selected at the output terminal of the driver circuit in at least one state of the tri-state switching operation. Thereafter, the driver circuit may be configured to generate an output data signal at an output data rate for a load connected to the output terminal such that a difference between the input data rate of the received input data signal and the output data rate of the output data signal is minimum.

In accordance with an embodiment, the plurality of latch circuits that may be coupled to each other in the master and slave configuration may correspond to a complementary data flip flop circuit. The complementary data flip flop circuit may be configured to latch a plurality of input data bits in accordance with the plurality of clock signals. In accordance with an embodiment, the plurality of latch circuits that may be coupled to each other in the master and slave configuration may correspond to a clock divider circuit. The clock divider circuit may be configured to output a plurality of complementary clock signals at a signal frequency that is a fraction of a signal frequency associated with the plurality of clock signals provided as an input to the plurality of latch circuits.

The present disclosure may be realized in hardware, or a combination of hardware and software. The present disclosure may be realized in a centralized fashion, in at least one computer system, or in a distributed fashion, where different elements may be spread across several interconnected computer systems. A computer system or other apparatus adapted for carrying out the methods described herein may be suited. A combination of hardware and software may be a general-purpose computer system with a computer program that, when loaded and executed, may control the computer system such that it carries out the methods described herein. The present disclosure may be realized in hardware that comprises a portion of an integrated circuit that also performs other functions.

The present disclosure may also be embedded in a computer program product, which comprises all the features enabling the implementation of the methods described herein, and which when loaded in a computer system is able to carry out these methods. Computer program, in the present context, means any expression, in any language, code or notation, of a set of instructions intended to cause a system having an information processing capability to perform a particular function either directly, or after either or both of the following: a) conversion to another language, code or notation; b) reproduction in a different material form.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A tri-state circuit, comprising:
   a driver circuit that comprises:
      a first type of transistor connected in series with a second type of transistor, and
      an output terminal that is coupled to a node present at a connection between the first type of transistor and the second type of transistor;
   a control circuit that is coupled to the driver circuit through input terminals of the driver circuit, wherein the control circuit is configured to:
      supply, based on an input data signal received at an input data rate and a plurality of received clock signals, a first signal and a second signal to the first type of transistor and the second type of transistor of the driver circuit through the input terminals of the driver circuit; and
      control a tri-state switching operation of the first type of transistor and the second type of transistor in accordance with the first signal and the second signal such that the input data signal is selected at the output terminal of the driver circuit in at least one state of the tri-state switching operation,
   wherein the driver circuit is further configured to generate an output data signal at an output data rate for a load connected to the output terminal such that a difference between the input data rate of the received input data signal and the output data rate of the output data signal is minimum.

2. The tri-state circuit according to claim 1, wherein the output data rate of the output data signal is based on a transient response time to charge a combined self-loading capacitance of the first type of transistor and the second type of transistor.

3. The tri-state circuit according to claim 2, wherein the difference between the input data rate of the input data signal and the output data rate of the output data signal is minimum, based on a charge time and a discharge time for the combined self-loading capacitance of the first type of transistor and the second type of transistor of the driver circuit.

4. The tri-state circuit according to claim 3, wherein the charge time and the discharge time for the combined self-loading capacitance of the first type of transistor and the second type of transistor is synchronized with a duration of a falling edge or a rising edge of the plurality of clock signals.

5. The tri-state circuit according to claim 3, wherein the charge time and the discharge time for the combined self-loading capacitance of the first type of transistor and the second type of transistor is based on an amplitude of a drive current generated by the driver circuit to the load through the output terminal.

6. The tri-state circuit according to claim 5, wherein the drive current for the load coupled to the output terminal is based on a number of the first type of transistor and the second type of transistor in a serial network of the driver circuit.

7. The tri-state circuit according to claim 1, wherein the first type of transistor is coupled to a power supply in a pull-up configuration, and the second type of transistor is connected to a reference ground in a pull-down configuration.

8. The tri-state circuit according to claim 1, wherein the first type of transistor is a p-type metal-oxide semiconductor (MOS) transistor and the second type of transistor is an n-type MOS transistor.

9. The tri-state circuit according to claim 1, wherein the control circuit comprises a NAND gate and a NOR gate, and wherein an output terminal of the NAND gate and the NOR gate is coupled to the driver circuit through the input terminals of the driver circuit, and wherein a set of input terminals of the NAND gate and the NOR gate are configured to receive the input data signal and the plurality of clock signals.

10. The tri-state circuit according to claim 1, wherein the control circuit comprises an AND gate and an OR gate, and wherein an output terminal of the AND gate and the OR gate is coupled to the driver circuit through the input terminals of the driver circuit, and wherein a set of input terminals of the AND gate and the OR gate are configured to receive the input data signal and the plurality of clock signals.

11. The tri-state circuit according to claim 1, wherein the control circuit comprises a plurality of first type of transistors and a plurality of second type of transistors arranged in accordance with a type of network configuration, wherein the type of network configuration specifies an interconnection of different terminals of the plurality of first type of transistors and the plurality of second type of transistors to each other and to the input terminals of the driver circuit.

12. The tri-state circuit according to claim 1, wherein the control circuit comprises:
a pair of NAND and NOR gates coupled to the driver circuit through the input terminals of the driver circuit; and
a pair of AND and OR gates coupled to the pair of NAND and NOR gates in a cascaded configuration, wherein a set of input terminals of the pair of AND and OR gates comprise different terminals that are configured to receive the input data signal and the plurality of clock signals.

13. The tri-state circuit according to claim 1, wherein the plurality of clock signals comprises a plurality of first clock signals and a plurality of second clock signals that are complementary in phase to the plurality of first clock signals.

14. The tri-state circuit according to claim 1, is switched between an open circuit high impedance mode and a closed circuit low impedance mode, in accordance with a rising edge or a falling edge of the plurality of clock signals in the tri-state switching operation of the first type of transistor and the second type of transistor in the driver circuit.

15. A parallel-to-serial converter circuit, comprising:
a plurality of tri-state circuits configured to:
received a plurality of input data signals in parallel at a first input data rate through a plurality of input data terminals of the plurality of tri-state circuits; and
generate an output data signal serially at a first output data rate through a combined output terminal of the plurality of tri-state circuits, based on a tri-state switching operation of the plurality of tri-state circuits in accordance with the received plurality of input data signals,
wherein each tri-state circuit of the plurality of tri-state circuits comprises:
a driver circuit that comprises:
a first type of transistor connected in series with a second type of transistor, and
an output terminal that is coupled to a node present at a connection between the first type of transistor and the second type of transistor;
a control circuit that is coupled to the driver circuit through input terminals of the driver circuit, wherein the control circuit is configured to:
supply, based on an input data signal received at an input data rate and a plurality of received clock signals, a first signal and a second signal to the first type of transistor and the second type of transistor of the driver circuit through the input terminals of the driver circuit; and
control the tri-state switching operation of the first type of transistor and the second type of transistor in accordance with the first signal and the second signal such that the input data signal is selected at the output terminal of the driver circuit in at least one state in the tri-state switching operation, and
wherein the driver circuit is further configured to generate an output data signal at an output data rate for a load connected to the output terminal such that a difference between the input data rate of the received input data signal and the output data rate of the output data signal is minimum.

16. The parallel-to-serial converter circuit according to claim 15, wherein the plurality of clock signals comprises a plurality of first clock signals and a plurality of second clock signals complementary in phase to the plurality of first clock signals.

17. The parallel-to-serial converter circuit according to claim 15, further comprising a phased clock circuit that is configured to generate the plurality of clock signals having a phase difference equal to a duration of a bit in the output data signal.

18. The parallel-to-serial converter circuit according to claim 17, wherein the plurality of clock signals are associated with a signal frequency that is equal to a fraction of the first output data rate of the output data signal, wherein the fraction of the first output data rate corresponds to a reciprocal of a number of tri-state circuits.

19. The parallel-to-serial converter circuit according to claim 15, further comprising a first clock circuit and a second clock circuit, wherein the first clock circuit is configured to generate a plurality of phased clock signals at a first signal frequency that is equal to a reciprocal of a number of tri-state circuits times the first output data rate, to pre-select the plurality of input data signals, and wherein the second clock circuit is configured to generate a second plurality of phased clock signals at a second signal frequency that is equal to half the first output data rate, to select one data bit of the output data signal from a plurality of input bits of the plurality of input data signals.

20. A memory circuit, comprising:
a plurality of latch circuits coupled in a master and slave configuration, wherein each latch circuit comprises two tri-state circuits having a pair of complementary output terminals cross-coupled with a pair of inverter circuits, wherein each latch circuit is configured to:
stagger a pair of complementary data bits in time to set a time margin for selection of an input data bit from a plurality of input data signals in accordance with a plurality of clock signals,
wherein each tri-state circuit of the two tri-state circuits comprises:
a driver circuit that comprises:
a first type of transistor connected in series with a second type of transistor, and
an output terminal that is coupled to a node present between a connection of the first type of transistor and the second type of transistor; and
a control circuit that is coupled to the driver circuit through input terminals of the driver circuit, wherein the control circuit is configured to:
supply, based on an input data signal received at an input data rate and a plurality of received clock signals, a first signal and a second signal to the first type of transistor and the second type of transistor of the driver circuit through the input terminals of the driver circuit; and
control a tri-state switching operation of the first type of transistor and the second type of transistor in accordance with the first signal and the second signal such that the input data signal is selected at the output terminal of the driver circuit in at least one state in the tri-state switching operation, and
wherein the driver circuit is further configured to generate an output data signal at an output data rate for a load connected to the output terminal such that a difference between the input data rate of the received input data signal and the output data rate of the output data signal is minimum.

21. The memory circuit according to claim 20, wherein the plurality of latch circuits coupled to each other in the master and slave configuration corresponds to a complementary data flip flop circuit to latch a plurality of input data bits in accordance with the plurality of clock signals.

22. The memory circuit according to claim 20, wherein the plurality of latch circuits coupled to each other in the master and slave configuration correspond to a clock divider circuit to output a plurality of complementary clock signals at a signal frequency that is a fraction of a signal frequency associated with the plurality of clock signals provided as an input to the plurality of latch circuits.

* * * * *